(12) United States Patent
Wood et al.

(10) Patent No.: US 7,645,635 B2
(45) Date of Patent: Jan. 12, 2010

(54) FRAME STRUCTURE AND SEMICONDUCTOR ATTACH PROCESS FOR USE THEREWITH FOR FABRICATION OF IMAGE SENSOR PACKAGES AND THE LIKE, AND RESULTING PACKAGES

(75) Inventors: Alan G. Wood, Boise, ID (US); Kyle K. Kirby, Boise, ID (US); Warren M. Farnworth, Nampa, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 320 days.

(21) Appl. No.: 10/919,604

(22) Filed: Aug. 16, 2004

(65) Prior Publication Data

US 2006/0035415 A1    Feb. 16, 2006

(51) Int. Cl.
*H01L 21/00* (2006.01)

(52) U.S. Cl. ............... 438/113; 438/116; 257/E21.499; 257/E31.127

(58) Field of Classification Search ............ 438/27, 438/28, 29, 33, 108–127; 257/234, 414, 257/431–433, E31.127, E21.499, E21.5, 257/E21.524
See application file for complete search history.

(56) References Cited

U.S. PATENT DOCUMENTS

| | | |
|---|---|---|
| 5,600,541 A | 2/1997 | Bone et al. |
| 5,811,799 A | 9/1998 | Wu |
| 5,923,958 A | 7/1999 | Chou |
| 6,022,758 A | 2/2000 | Badehi |
| 6,040,235 A | 3/2000 | Badehi |
| 6,262,479 B1 | 7/2001 | Chou |
| 6,285,064 B1 | 9/2001 | Foster |
| 6,353,257 B1 | 3/2002 | Huang |
| 6,368,896 B2 | 4/2002 | Farnworth et al. |
| 6,383,835 B1 * | 5/2002 | Hata et al. ............ 438/65 |
| 6,384,473 B1 | 5/2002 | Peterson et al. |
| 6,503,780 B1 | 1/2003 | Glenn et al. |
| 6,624,505 B2 | 9/2003 | Badehi |

(Continued)

OTHER PUBLICATIONS

"Miniature Autofocus Camera," I LTD, <www.1limited.com>, 2003, 2 pages.

(Continued)

*Primary Examiner*—Khiem D Nguyen
(74) *Attorney, Agent, or Firm*—TraskBritt

(57) ABSTRACT

A semiconductor package such as an image sensor package, and methods for fabrication. A frame structure includes an array of frames, each having an aperture therethrough, into which an image sensor die in combination with a cover glass, filter, lens or other components may be installed in precise mutual alignment. Singulated image sensor dice and other components may be picked and placed into each frame of the frame structure. Alternatively, the frame structure may be configured to be aligned with and joined to a wafer bearing a plurality of image sensor dice, wherein optional, downwardly protruding skirts along peripheries of the frames may be received into kerfs cut along streets between die locations on the wafer, followed by installation of other package components. In either instance, the frame structure in combination with singulated image sensor dice or a joined wafer is singulated into individual image sensor packages. Various external connection approaches may be used for the packages.

119 Claims, 8 Drawing Sheets

U.S. PATENT DOCUMENTS

| | | | |
|---|---|---|---|
| 6,646,289 | B1 | 11/2003 | Badehi |
| 6,649,991 | B1 | 11/2003 | Chen et al. |
| 6,680,525 | B1* | 1/2004 | Hsieh et al. .................. 257/680 |
| 6,703,256 | B2 | 3/2004 | Nagata et al. |
| 6,713,857 | B1 | 3/2004 | Tsai |
| 6,717,126 | B1 | 4/2004 | Glenn et al. |
| 6,724,060 | B2 | 4/2004 | Maeda |
| 6,727,487 | B2 | 4/2004 | Yamaguchi et al. |
| 6,730,536 | B1 | 5/2004 | Glenn et al. |
| 6,962,834 | B2* | 11/2005 | Stark ........................... 438/107 |
| 7,012,315 | B1* | 3/2006 | Campbell .................... 257/433 |
| 7,274,094 | B2 | 9/2007 | Boon et al. |
| 7,327,005 | B2* | 2/2008 | Brechignac et al. ......... 257/434 |
| 7,364,934 | B2* | 4/2008 | Street et al. .................. 438/66 |
| 2004/0038442 | A1 | 2/2004 | Kinsman |
| 2005/0214969 | A1* | 9/2005 | Gore et al. .................. 438/106 |

OTHER PUBLICATIONS

"VisionPack™ LLC," Amkor Technology, <www.amkor.com>, 2001, 2 pages.

Berthold et al., "Low temperature wafer-to-wafer bonding for MEMS applications," STW, Oct. 26, 1998-01:007, p. 31-33.

Ma et al., "Low Temperature Bonding for Wafer Scale Packaging and Assembly of Micromachined Sensors," Dept. of Electrical & Computer Engineering, Univ. of CA, Final Report 1998-99 for MICRO Project 98-144.

"Philip's fluid lenses bring things into focus," Royal Philips Electronics, Press Information, Mar. 3, 2004, 3 pages.

"Hermetic Plastic Packages for Telecom/Datacom Applications," Quantum Leap, <www.qlpkg.com>, Date unknown, 1 page.

U.S. Appl. No. 10/664,845, filed Sep. 17, 2003, Entitled—Image Sensor Packages and Methods of Fabrication.

* cited by examiner

FRAME STRUCTURE AND SEMICONDUCTOR ATTACH PROCESS FOR USE THEREWITH FOR FABRICATION OF IMAGE SENSOR PACKAGES AND THE LIKE, AND RESULTING PACKAGES

BACKGROUND OF THE INVENTION

1. Field of the Invention

The present invention relates to semiconductor devices, intermediate structures in the fabrication thereof and components and fabrication methods therefor. More particularly, the invention pertains to methods for fabricating packaged radiation sensing or emitting devices, cameras including same, and the like, intermediate structures at the wafer or bulk substrate level in the fabrication, frame structures for use in fabrication of the packages and methods of package fabrication.

2. State of the Art

Semiconductor die-based image sensors are well known to those having skill in the electronics/photonics art and, in a miniaturized configuration, are useful for capturing electromagnetic radiation (e.g., visual, IR or UV) information in digital cameras, personal digital assistants (PDA), internet appliances, cell phones, test equipment, and the like, for viewing, further processing or both. For commercial use in the aforementioned extremely competitive markets, image sensor packages must be very small. For some applications, a package of a size on the order of the semiconductor die or chip itself, or a so-called "chip scale" package, is desirable if not a requirement. In addition, the market demands that image sensors provide high quality images, be inexpensive and exhibit low failure rates while accommodating the rough treatment typical of general use, particularly in cameras and other hand-held devices. Unfortunately, the semiconductor industry has yet to achieve these goals in full. Currently available image sensor packages are relatively expensive to manufacture, are significantly larger than the image sensor semiconductor die, and exhibit a failure rate which is unacceptably high, limiting further market penetration through cost reduction.

While traditional semiconductor devices, such as processors and memory, are conventionally packaged in an opaque protective material, image sensors typically comprise a light wavelength frequency radiation-sensitive integrated circuit (also termed an "optically sensitive" circuit) fabricated on the active surface of a semiconductor die covered by a planar, optically transmissive element, wherein the image sensor is positioned to receive light radiation from an external source. Thus, one surface of the image sensor package conventionally comprises a transparent portion, which usually is a lid of light-transmitting glass or plastic. For photographic purposes, the chip is positioned to receive focused radiation from an optical lens associated therewith. The semiconductor circuit is typically one of a charge coupling device (CCD) or a complementary metal oxide semiconductor (CMOS), the latter exhibiting distinct advantages over the former and being the currently preferred sensor used in the image-sensing art.

Various factors are considered in the design and manufacture of image sensor packages. For example, the extent that the packages can be at least partially, if not completely, fabricated at the wafer level is a substantial cost consideration. Furthermore, if the package design or fabrication approach, even if conducted at the wafer level, necessitates that all of the image sensor semiconductor dice located thereon be packaged regardless of whether a significant number of the dice are defective, a substantial waste of materials results. Also, the package lids (e.g., windows) as well as one or more associated lenses (when included in an image sensor package) must be carefully positioned relative to the optically sensitive circuit on each of the dice to achieve uniformly high quality imaging while precluding entry of moisture and other contaminants into the chamber defined between the optically sensitive circuitry and the package lid. Other considerations include those which relate to die packaging in general, including the need for moisture resistance in the package as a whole and adequate physical protection of the integrated circuitry, as well as elimination of resin flash and outgassing problems. Further, the packaging must provide adequately robust connectors for effecting uniformly high quality electrical connections to higher-level packaging.

A conventional method for packaging a semiconductor element is depicted in U.S. Pat. No. 6,262,479 to Li-Kun Chou. As shown therein, a die "seat" is first mounted on a substrate, together with metal traces extending to the edge of the substrate, and over the edge surfaces. A thin liner of insulative material is then applied about the periphery of the upper surface of the substrate. A peripheral wall of molding compound is then applied over the liner. A semiconductor, such as an image sensor die, is then fixed to the substrate, and the bond pads thereof are wire-bonded to the metal conductors on the substrate. A cover glass is then adhesively attached over the peripheral wall to enclose the die.

As shown in U.S. Pat. No. 6,353,257 to Huang, an image sensor chip may be attached to a conductive lead frame, with its bond pads wire-bonded to the lead frame. The lead frame is then placed in a mold where a body is formed about the lead frame with a shouldered upper opening over the chip. A cover glass is then adhesively attached to the upper rim of the molded body.

In U.S. Pat. No. 6,727,487 to Yamaguchi et al., a CMOS image sensor is described wherein a sensor chip with peripheral bond pads is attached to a printed circuit board, and peripheral bond pads are wire-bonded to circuit board metallization. An array of flat color filters and microlens is placed over the active sensor area and nearly extends to opposing rows of peripheral bond pads. A lens mounted in a four-legged holder may then be placed directly on the microlens layer to maintain a uniform focusing distance between the active area and lens. Packaging of the device is not in view.

U.S. Pat. No. 6,713,857 to Tsai describes a stacked two-chip package in which a substrate is first formed with metal leads on each side, and has an opening therein. Adhesive tape is attached to the substrate to cover the opening, and a first chip is attached to the tape within the opening. A second chip such as an image sensor chip is then attached to the opposite side of the adhesive tape. The bond pads of each chip are wire-bonded to metallization on the respective surfaces of the substrate. Encapsulant is formed about the first chip and its wire bonds. An encapsulant is formed about the edges of the substrate, forming a wall enclosing the second chip. A cover is then attached to the wall, and may be optically conductive.

In U.S. Pat. No. 6,730,536 to Glenn et al., a method for forming an image sensor package is disclosed in which a central through-aperture is formed in a substrate. Electrically conductive traces are formed on the lower surface of the substrate, and include tabs projecting inwardly under the central aperture. An image sensor stall is flip-chip mounted to the tabs by bumps. A window is then mounted over the optically active portion of the image sensor chip. Holes through the substrate intersect the lower surface traces, and are filled with solder which projects upwardly from the substrate as solder balls.

In U.S. Pat. No. 6,649,991 to Chen et al., a method is disclosed for making an image sensor package with a vision chip mounted on a multi-layer resin-mask organic substrate. The chip's peripheral bond pads are wire-bonded to conductors on the substrate. A transparent window is mounted over a large portion of the vision chip, including the optically active area. The bond wires and adjacent areas are encapsulated in a wire shielding block, up to the window edges. A liquid encapsulant is then applied to cover the block and edges of the window to seal it in place.

U.S. Pat. No. 6,503,780 to Glenn et al., a wafer scale image sensor package fabrication method is described, in which an image sensor is formed by placing a cover glass in a hardenable layer atop the active sensing area on the chip. The package is then molded about the die, sensing area and cover glass.

Despite advances in the state of the art of image sensor packaging, there remains a need for a high-yield packaging technique which may be effected at a wafer level and provides robust, high quality image sensor packages.

BRIEF SUMMARY OF THE INVENTION

The present invention comprises, in a number of embodiments, methods for packaging semiconductor dice having radiation-responsive or emissive, or other optically active properties in the integrated circuitry thereof requiring a disposition thereover of a cover transparent or otherwise sufficiently transmissive to radiation of a particular wavelength or range of wavelengths. For purposes of convenience, and without limitation of the present invention, such semiconductor dice may be referred to herein as "image sensor dice." The invention also includes, in a number of embodiments, packages including image sensor dice and, for purposes of convenience and without limitation of the present invention, semiconductor packages including image sensor dice may be referred to herein as "image sensor packages."

In one embodiment of this invention, a frame structure is preformed with a plurality of unsingulated frames, each unsingulated frame including an aperture therethrough including a plurality of steps and into each of which a singulated image sensor die is inserted.

In another embodiment, the frame structure is superimposed on, and attached to, an unsingulated wafer of image sensor dice, wherein each image sensor die location occupies an aperture of a frame, to form an intermediate structure which may be singulated into individual frames, each with an image sensor die carried thereby. In this embodiment, the frames may optionally include protrusions sized and configured to be received in kerfs cut into the active surface of the wafer. However, the frame structure may also be formed without the aforementioned protrusions, so as to reside on and be adhered to the active surface of an unkerfed wafer.

Each frame aperture may also be configured to receive and respectively retain in desired mutual relationship, a window or cover glass, optical lens(es), filters, and other components such as electrical conductors, or combinations of the foregoing, as dictated by the particular, intended use for the image sensor die. However, rather than inserting discrete, individual components into each frame, a window or cover glass, lenses, filters and other components may be fabricated in the form of bulk sheets or other bulk substrates including a plurality of the component in question corresponding to the number of frames in a frame structure, laid over and adhered to an upper surface of the frame structure and singulated in conjunction with singulation of the frames and dice. A spacer grid may be used between bulk substrates to provide vertical separation between components.

In each of the foregoing embodiments, the frame structure (as well as the underlying wafer, as applicable) is cut along the horizontal, X and Y axes and transverse to the plane of the frame structure between adjacent frames to singulate the individual image sensor packages. While the present invention will be described with respect to the fabrication of image sensor packages, in which radiation is detected by an optically active region (image array) on the active surface of a semiconductor die, but is not so limited. The present invention may be applied to packaging of any type of semiconductor dice, as desired, and the present invention encompasses the packaging of same.

In accordance with the present invention, a frame structure defining a plurality of adjacent frame locations, each frame location including an aperture therethrough and separated by shared frame protrusions, is formed by any suitable method. For example, the frame structure may be formed of a polymer by injection molding, or from a silicon wafer by laser cutting or etching. The frame structure may also be formed of a ceramic by pressing and sintering, or a metal or alloy by stamping, pressing, casting or machining. Polymer frame structures may optionally be constructed using stereolithographic techniques employing a UV-sensitive photopolymer, or other processes as known in the art. For most applications, molded polymeric frame structures may be preferred because of cost considerations. The frame structure is configured so that each aperture is configured for sealed mounting of a completed, bare image sensor die in combination with an overlying window, such as a cover glass and, optionally, a light filter as well as other desired components disposed between the window and the active surface of the image sensor die. As previously mentioned, an aperture may be further configured to retain an optical lens (focusable, autofocusing or nonfocusing). The frame structure may also be configured to provide substantial or complete encapsulation of the lateral sides of the image sensor die extending at least below the integrated circuitry on the active surface, providing coverage of at least a portion of the lateral sides upon singulation of the individual image sensor packages.

The frames of the frame structure may each be configured to include electrical conductors in the form of conductive traces having contacts accessible from the aperture interior and extending to locations on the frame exterior which may be exposed either before or after singulation of the frame structure for application of external electrical connections and the like. The use of flex circuit external connection structures applied to the frame structure at a wafer level or to individual singulated frames, each carrying a semiconductor die, is encompassed by the present invention. Thus, the image sensor package configuration may be that of a ball-grid array (BGA), a leadless chip carrier (LCC), a quad flat pack (QFP), quad flat no-lead (QFN) or other package types known in the art. The back side of the image sensor die may be encapsulated, which may be effected at the wafer level.

As noted above, the frame structure may be configured to be aligned with, and joined to, a wafer bearing a plurality of image sensor dice, wherein singulation of the combined frame structure and wafer results in a plurality of image sensor packages. Thus, the frame structure may be generally circular, with frames having apertures disposed in matching arrangement to a pattern of image sensor dice of the wafer. Where a prior test, such as a probe test or wafer level burn-in, of the image sensor dice on the wafer indicates that a particular image sensor is defective, installation of a cover glass, filters, lens, etc. in the aperture of the corresponding frame location is omitted, saving production costs. At the present state of the image sensor die fabrication art, where the percentage of good dice may be relatively low, the attendant savings in time and materials using this approach can be substantial. The combined frame structure and wafer with all image sensor package components installed is then singulated into image sensor packages, and frames with defective image sensor dice discarded.

In another embodiment, the image sensor dice may be first singulated from a wafer and then individually placed and bonded within frames of a frame structure. In this embodiment, the frame structure may be formed in a generally rectangular shape. Image sensor dice singulated from a wafer and, optionally, established as known good die (KGD) through burn-in testing are picked and inserted into each aperture of a frame of the frame structure, together with optical members and other desired components. The backside of the image sensor dice may be encapsulated, followed by singulation of the filled frame structure into a plurality of individual image sensor packages. In this embodiment, an individual semiconductor die may be inserted into an aperture from above or below the frame structure, the frames being respectively configured to accommodate one or the other approach to assembly.

The methods of the invention offer substantial advantages over conventional packaging techniques employed for optically active semiconductor devices. First, very small, substantially chip scale, packages may be formed with a minimum number of fabrication acts. The requirement for a separate carrier substrate to support the image sensor die, cover glass and other components is eliminated. The use of one or more precisely placed steps in the aperture walls enables precise positioning of the image sensor die as well as the cover glass and, if employed, other elements, such as filters and lenses, to ensure accurate relative positioning of each component relative to the others and to the radiation sensitive image array on the active surface of the image sensor die. If desired, the package may be formed so that the cover glass abuts the optically active region of the die. Use of a frame structure carrying a large plurality of frames and singulation of the frames with individual image sensor dice installed substantially increases production throughput, and completing assembly of image sensor packages using only known good image sensor dice, either presingulated or identified on a wafer, further saves assembly time as well as materials in the form of cover glasses, filters and lenses.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

In the drawings, which depict exemplary embodiments of various features of the present invention, and in which various elements are not necessarily to scale.

DETAILED DESCRIPTION OF THE INVENTION

Figure 2:
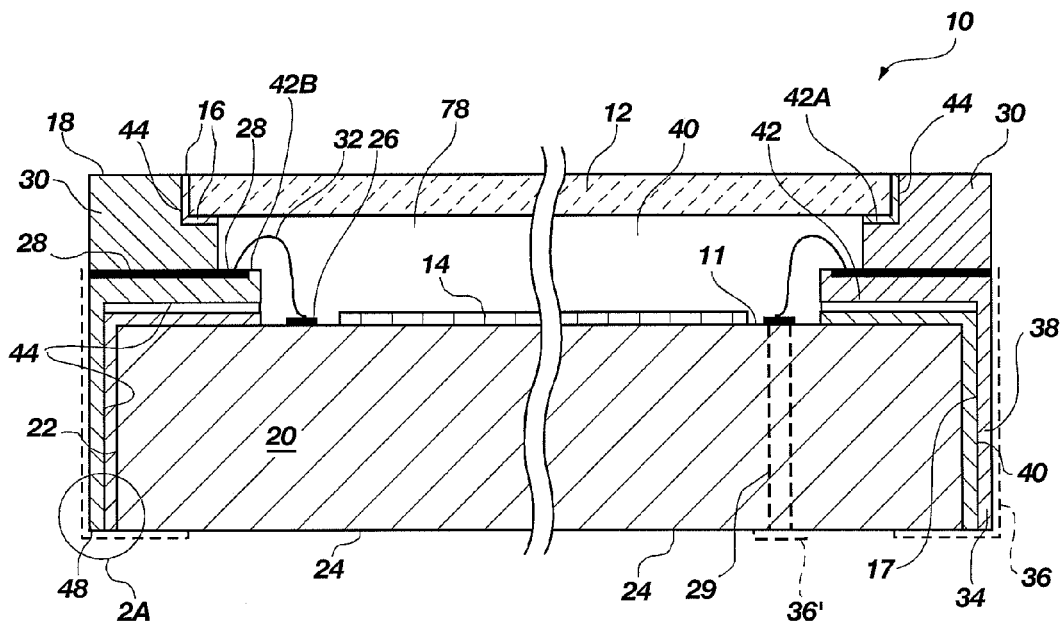
FIG. 2 is a cross-sectional lateral view of an exemplary semiconductor package including an optically transmissive window or cover glass, fabricated in accordance with the present invention.

Referring in general to the accompanying drawings, various aspects of the present invention are illustrated to show exemplary semiconductor package structures and methods for assembly of such package structures. Common elements of the illustrated embodiments are designated with like reference numerals. It should be understood that the figures presented are not meant to be illustrative of actual views of any particular portion of a particular semiconductor package structure, but are merely idealized schematic representations which are employed to more clearly and fully depict the invention.

Figure 1:
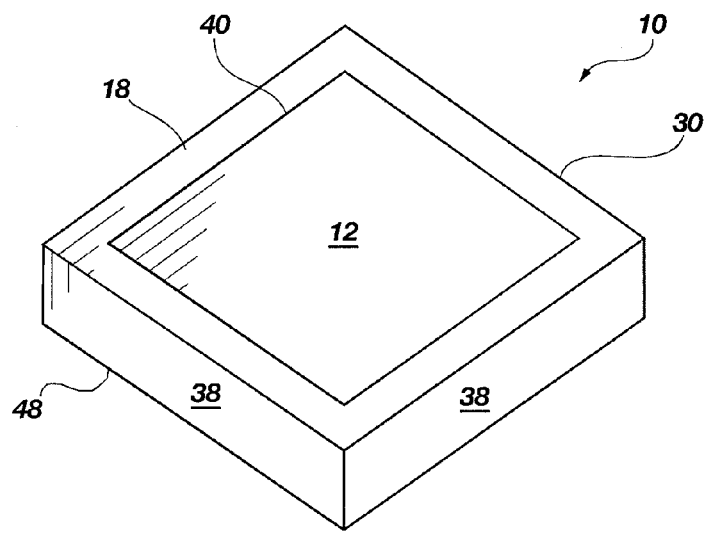
FIG. 1 is an upper isometric view of an exemplary semiconductor package in accordance with the present invention.
Figure 3:
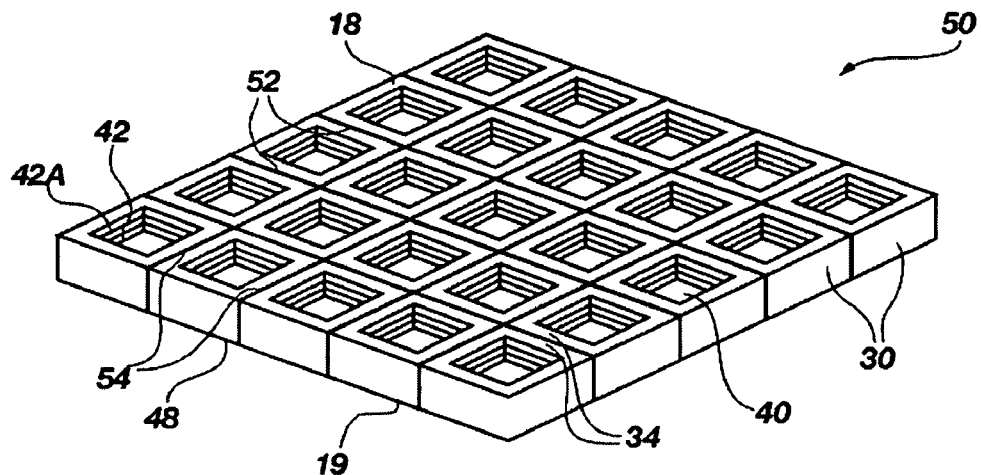
FIG. 3 is an upper isometric view of an exemplary frame structure in accordance with the present invention.
Figure 4:
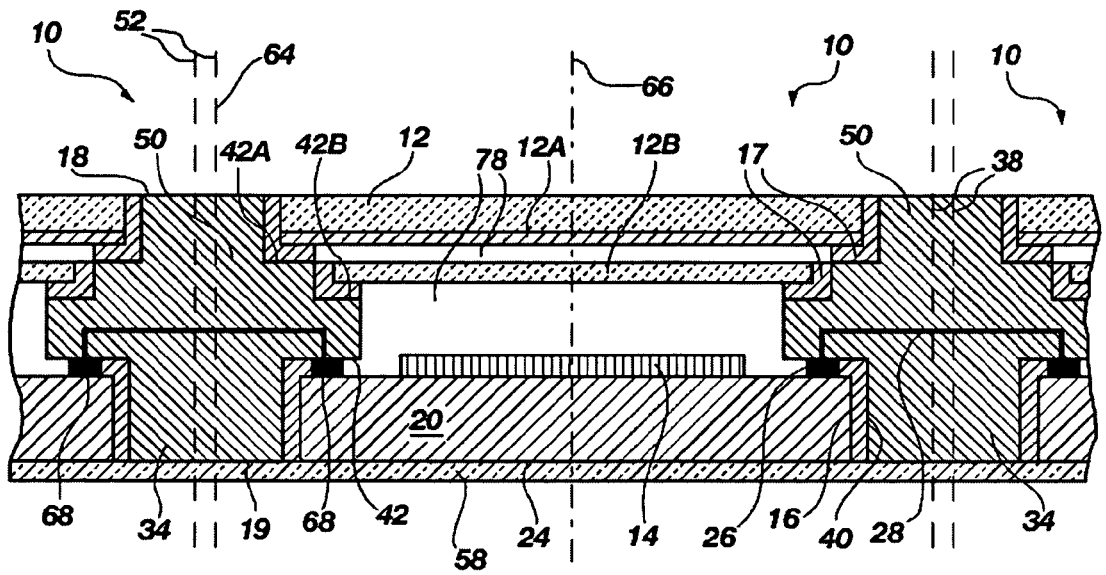
FIG. 4 is a cross-sectional lateral view of an exemplary unsingulated frame structure including a plurality of frames defining image sensor packages having DCA die connections in accordance with the present invention.

In one embodiment of the present invention, illustrated in FIGS. 1 and 2, an exemplary semiconductor package 10 is formed with a rectangular, radiation-transmissive window 12 superimposed over and in spaced relationship to an optically active region 14 on active surface 11 of a semiconductor die 20 in the form of an image sensor die or other optically active die, the term "optically active" encompassing any semiconductor die which is configured to sense or emit electromagnetic radiation. Of course, other window configurations, including nonplanar configurations, are contemplated as within the scope of the invention. For example, round, ovoid hexagonal, octagonal and other polygonal window shapes may be employed. As noted above, semiconductor die 20 may comprise an image sensor die in the form of a CMOS imager and optically active region 14 may comprise an imager array of the CMOS imager. The exemplary semiconductor package 10 of the present invention carries rectangular window 12 mounted in an aperture 40 in the upper surface 18 of a frame 30 and bonded to frame 30 using an adhesive 16. As shown, the frame 30 extends about a lateral periphery of semiconductor die 20 and covers all or at least a major portion of the lateral sides 22 of semiconductor die 20 while leaving the back side 24 thereof uncovered. The relatively thin, downwardly extending lateral portions or skirts 38 of the frame 30 which encapsulate the lateral sides 22 of the semiconductor die 20 comprise portions of frame protrusions 34 which are cut through the centers thereof in a singulation step to result in a plurality of semiconductor packages 10 from a frame structure 50 including a plurality of frames 30 (FIGS. 3 and 4). The term "cutting" is used when referring to singulation as such may be conventionally effected by using, for example, a wafer saw, but will be understood to include the sawing, etching, laser cutting or other method suitable for severing the material selected for frame structure 50. In the embodiment of FIG. 2, bond pads 26 on the semiconductor die 20 are connected by wire bonds 32 to conductors 28 formed in the frame 30 and extending to the exterior thereof may be accessed from external connectors 36, shown in broken lines in FIG. 2 as traces extending down skirts 38 to pads on the underside of semiconductor package 10. Alternatively, as shown in broken lines on the right hand side of FIG. 2, semiconductor die 20 may include conductive, through wafer interconnects or vias 29 that extend from bond pads 26 through semiconductor die 20 to back side 24. According to this configuration, external connectors in the form of terminal pads 36' may be formed over vias 29 on back side 24, and conductors 28 and wire bonds 32 may be omitted. If desired, conductive bumps (not shown) may be disposed or formed on terminal pads 36', as known in the art or other connection structures, as further described below, may be employed. Of course, a back side redistribution layer comprising traces extending from vias 29 to other locations on the back side 24 may also be employed.

It is noted that in this embodiment, a singulated semiconductor die 20 which has preferably been established as KGD is mounted in an aperture 40 of each frame 30 of the frame structure 50 using, for example, a pick-and-place machine (not shown), as is well known in the art. Each semiconductor die 20 may be adhesively attached and sealed to a surface 44 of an inverted step 42 in an aperture 40 as well as to other surfaces 44 within aperture 40. Inverted step 42 is formed about all four sides of aperture 40 to provide support and sealing completely around periphery of the active surface 11 of semiconductor die 20. As shown in this embodiment, without limitation thereby, semiconductor die 20 may have rows of bond pads 26 along one, two, three, or four peripheral edges of the active surface 11. The methods of the invention are also useful for packaging other devices, irrespective of the bond pad configuration.

The terms "upper," "lower," "top" and "bottom" are used for convenience only in this description of the invention in conjunction with the orientations of features depicted in the drawing figures. However, these terms are used generally to denote opposing directions and positions, and not in reference to gravity. For example, semiconductor package 10 may, in practice, be oriented in any suitable direction during fabrication or use.

An exemplary frame structure 50 of the invention as shown in FIG. 3 has an upper surface 18 and a lower surface 19. The frame structure 50 comprises a plurality of frames 30, each frame with an aperture 40 formed therethrough. The aperture 40 is shown as having a generally rectangular, e.g., square, cross-section throughout, with steps (shelves) 42, 42A, 42B, etc. (see FIGS. 1, 4 and 10), extending about each side thereof. The steps 42, 42A and 42B may be configured for four-sided, sealed mounting of a singulated prefabricated semiconductor die 20 and other components therein including a window 12 such as a cover glass, as well as optical filters and/or lens and the like. The aperture 40 may be configured with as many steps 42, 42A, 42B, etc., as are useful for mounting the various components required for the semiconductor package being fabricated, based on its intended use. As shown in FIG. 1, semiconductor die 20 has its active surface 11 attached to inverted step 42 of frame 30. The active surface 11 as well as lateral sides 22 of semiconductor die 20 may be respectively sealed to inverted step 42 as well as to other internal surfaces 44 of the frame 30 by an adhesive material 17. Once the internal components of the semiconductor package 10 are installed and sealed within the aperture 40, the individual frames 30 comprising semiconductor packages 10 may be singulated by cutting transversely to the plane of frame structure 50 between frames 30 surrounding each aperture 40, through frame protrusions 34 along cut lines 52, 54 (FIG. 3). The frame protrusions 34 are split down the centers thereof and parallel to the sides of the semiconductor dice 20 received therein into two portions during singulation. Each of the cut frame protrusions 34 provides a peripheral skirt 38 extending downwardly over semiconductor die 20 and defining a majority of a lateral exterior for one of the semiconductor packages 10.

Window 12, which may also be termed a cover glass, is shown as being generally rectangular, but (as noted above) is not limited to such shape and other polygonal shapes, as well as circular and nonplanar window shapes, may be employed. Window 12 may be formed of glass or other transparent or radiation-transmissive material such as a polymer. It may be formed of several layers and may be configured to selectively transmit radiation in a particular wavelength region, e.g., UV, infra-red, etc. Window 12 is preferably of high optical quality to provide uniform transmission therethrough of radiation over the entire usable field of the optically active region 14.

The embodiment of FIG. 2 is shown with conductors 28 molded or otherwise formed within frame 30 and extending inwardly on the upper surface of lower inverted step 42. Conductors 28 are formed for facilitating wire-bond connection to bond pads 26 on semiconductor die 20. Following installation of semiconductor die 20 in the frame 30, conductive wire bonds 32 are formed between bond pads 26 and the inner ends of conductors 28 and a window 12 is adhesively attached to upper step 42A in frame 30. As noted above, if conductive vias 29 are employed in semiconductor die 20, conductors 28 may be omitted from frames 30.

Figure 2A:
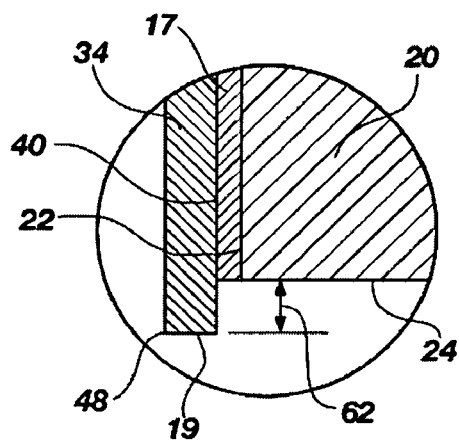
FIG. 2A is an enlarged portion of FIG. 2 showing an interim act in an alternate configuration of a semiconductor package in accordance with the present invention.
Figure 2B:
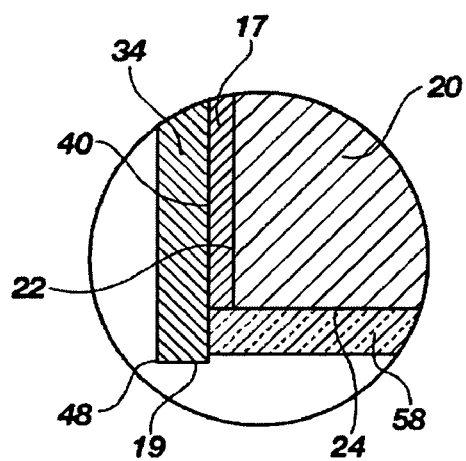
FIG. 2B is an enlarged portion of FIG. 2 showing a completed alternate configuration of a semiconductor package in accordance with the present invention.

As shown in FIG. 2A, the frame structure 50 may be configured with frame protrusions 34 having a lower edge 48 extending downwardly beyond the back side 24 of semiconductor die 20, providing a recessed region 62 into which curable dielectric encapsulant 58 may be applied to protect the back side 24 and seal the semiconductor die 20 within the frame structure (see FIG. 2B). A wide variety of applicable encapsulant materials are known in the art, and thermoplastic, thermosetting or photopolymers may be employed as desired. It is preferred, but not required, that encapsulant 58 be applied to the back sides 24 of semiconductor dice 20 prior to singulation of frame structure for speed and ease of application. Alternatively, frame protrusions 34 may be formed of a length so that back side 24 of a semiconductor die 20 lies substantially flush therewith, and an encapsulant spin-coated over the lower surface 19 and back sides 24 and cured, or a preformed sheet or film of dielectric material adhesively bonded thereto prior to singulation. As noted below with respect to FIG. 11B, if semiconductor die 20 includes conductive vias 29, a flex circuit type external connection structure may be applied to the back side of semiconductor die 20 either prior to or after singulation, or conductive bumps may be formed directly on terminal pads 36' and the remainder of the back side 24 covered with dielectric material.

The frame structure 50 may be formed by various methods, using various materials. For example, frame structure 50 may be formed from a semiconductive material, such as silicon. In this case, the apertures 40 may be formed by anisotropic etching with a dry or wet etchant, or alternatively by laser cutting, such methods being well known in the art. Frame structure 50 may also be formed of a ceramic by pressing and sintering, or by a metal or alloy by stamping, pressing, casting or machining, or a combination thereof. Further, frame structure 50 may be formed using known stereolithographic techniques from a UV-sensitive photopolymer.

The apertures 40 are formed to have a cross-sectional shape generally conforming to that of the semiconductor dice 20. For example, the die-retaining lower portion of the aperture 40 is intended to closely retain the die therein. However, the upper portions of apertures 40 including steps 42A and 42B, etc., may have a square cross-sectional shape, or other shape conforming, for example, to a shape of optically active region 14. Steps 42A and 42B may even have a circular shape, to be used with circular window(s) 12, filters 12A and lens 70.

For most applications, the frame structure 50 may be formed of a polymeric material, particularly in view of reduced cost as compared to that of semiconductor materials and processes used therefore, as well as of ceramics or metals. For example, the frame structure 50 may be formed of a polymeric material by injection molding or transfer molding. Methods and apparatus for injection molding such frame structures 50 are conventional and, thus, will not be further described. Polymeric materials such as, for example, liquid crystal polymers (LCP) obtainable from Quantum Leap Packaging of Wilmington, Mass. may be particularly suitable to fabricate frame structures 50 using injection molding. Rod-type polymers, such as are obtainable from HD Microsystems of Parlin, N.J., may also be utilized to fabricate frame structure 50. Other moldable polymers may, of course, be used. It may be preferred that the coefficient of thermal expansion (CTE) of the resulting frame structure 50 reasonably matches that of the semiconductor material from which semiconductor dice 20 are fabricated. Thus, thermal mismatch problems at temperatures and over temperature ranges encountered in fabrication, test and use of the semiconductor packages may be avoided.

The frame structure 50 may also be formed from photo-sensitive polymeric materials solidifiable by radiation, by using a stereolithographic process. In a general method of stereolithography, a precisely controlled radiation beam of UV wavelength radiation is directed upon the surface of a liquid polymer and used to solidify a thin layer of the photo-polymer. With controlled radiation application following repeated disposition of liquid photopolymer level over existing layers, a plurality of at least partially superimposed solid polymer layers is formed in a precise pattern to create the desired solid structure. Methods, apparatus and suitable photopolymers for automated stereolithographic fabrication of structures are known in the art, and will not be further described herein.

In the present invention, various components are attached to the frame structure 50. Where the frame structure 50 is formed of a semiconductor material such as silicon, the semiconductor die 20 may be attached to the frames 30 of frame structure 50 with a liquid or film adhesive(s) 16, 17 such as epoxy materials curable by exposure to ultraviolet (UV) radiation or by a thermal cure. The semiconductor material surfaces to be adhesively joined may be preoxidized where such action results in a bond of higher strength.

Attachment of a semiconductor die or glass to a semiconductor frame structure 50 may be also be accomplished utilizing anodic bonding and/or fusion bonding, as described in A. Berthold, et al., *Low Temperature Wafer-To-Wafer Bonding for MEMS Applications,* Proc. RISC/IEEE, 31-33, 1998 (ISBN 90-73461-15-4), the disclosure of which is incorporated by reference herein. Anodic bonding may be used to join silicon-to-silicon, silicon-to-glass and glass-to-glass, wherein a high voltage (800V) electric field induces adhesion at about 300° C. Alternatively, a lower temperature fusion bonding method may be used, including a first surface etching step, rinse, nitric acid treatment, rinse, prebonding of the components under force, and annealing at a somewhat elevated (120° C.) but generally lower temperature than is employed for anodic bonding.

Another approach suitable for bonding components of glass and semiconductor materials and particularly oxidized semiconductor materials is described in X. Ma, et al., *Low Temperature Bonding for Wafer Scale Packaging and Assembly of Micromachined Sensors,* Department of Electrical & Computer Engineering University of California, Davis, Calif. 95616, Final Report 1998-99 for MICRO Project 98-144, Industrial Sponsor(s): Kumetrix, Inc., the disclosure of which is incorporated by reference herein. The disclosed technique employs photopatternable polydimethylsiloxane (PDMS) using exposure to 420 nm UV with subsequent exposure to an $O_2$ plasma to enable immediate, room temperature contact bonding.

For an exemplary semiconductor package 10 as shown in FIGS. 1 and 2, the method of fabrication may be generally described as including the following acts, though not necessarily in the order presented.

A plurality of semiconductor dice 20, each having an optically active region 14 or the like on an active surface 11, are fabricated on a semiconductor wafer 60. As used herein, the term "wafer" encompasses bulk semiconductor substrates in addition to conventional wafers, such as silicon-on-insulator (SOI) substrates as exemplified by silicon-on-glass (SOG) substrates and silicon-on-sapphire (SOS) substrates. The usability of each semiconductor die 20 of wafer 60 is established as, for example, by KGD burn-in testing. Semiconductor dice 20 are then singulated from wafer 60 after the KGD have been identified and so marked.

A frame structure 50 is formed to include a plurality of frames 30, each having an aperture 40 passing between upper and lower surfaces 18, 19 of the frame structure 50, and configured with peripheral lower inverted step or ledge 42 for retaining a semiconductor die 20 by its active surface 11, an upper step 42A for retaining an upper window 12, and other steps 42B, etc., as desired to retain other optical components (including one or more lenses), provide support for electrical conductors, or for other purposes as required for the particular application.

A known good semiconductor die 20 is adhesively bonded to inverted step 42 in each aperture 40 to place the bond pads 26 of each semiconductor die 20 in communication with conductors 28. In the embodiment of FIG. 2, the inner ends of conductors 28 lie on step 42B and wire bonds 32 are formed between bond pads 26 and the conductor ends. In other embodiments, the electrical connection technique may differ.

Other components may be placed on additional inverted steps 42 and bonded thereto, as depicted in FIG. 4 wherein a pre-lens 12B is supported on step 42B.

A pre-cut window 12 is then placed in aperture 40 on step 42A and bonded thereto using an adhesive material or other suitable method. Depending on the intended end use for semiconductor package 10, where a lens is to be mounted within the aperture 40, it may sometimes be advantageous to eliminate window 12 from the package. This is particularly true where one or more filters are used.

A layer of dielectric encapsulant 58 may be disposed over the back side 24 of each semiconductor die 20 and, depending on the encapsulation method employed and the relative dimensions of semiconductor die 20 and surrounding frame protrusions 34, over adjacent areas on the lower surface 19 of frame structure 50.

The individual semiconductor packages 10 are singulated from the frame structure 50 by severing the frame structure 50 between adjacent frames 30 surrounding apertures 40 in the X and Y axes.

Figure 5:
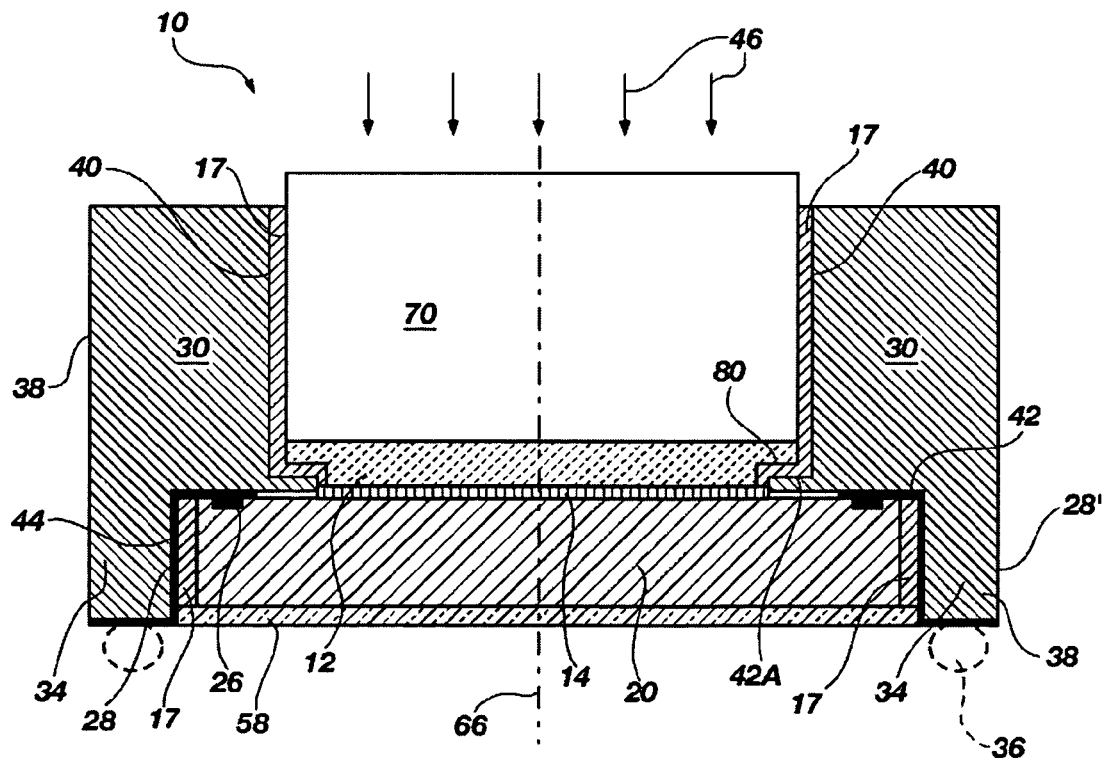
FIG. 5 is a cross-sectional lateral view of an exemplary frame of the present invention retaining an image sensor die and a camera lens.
Figure 5A:
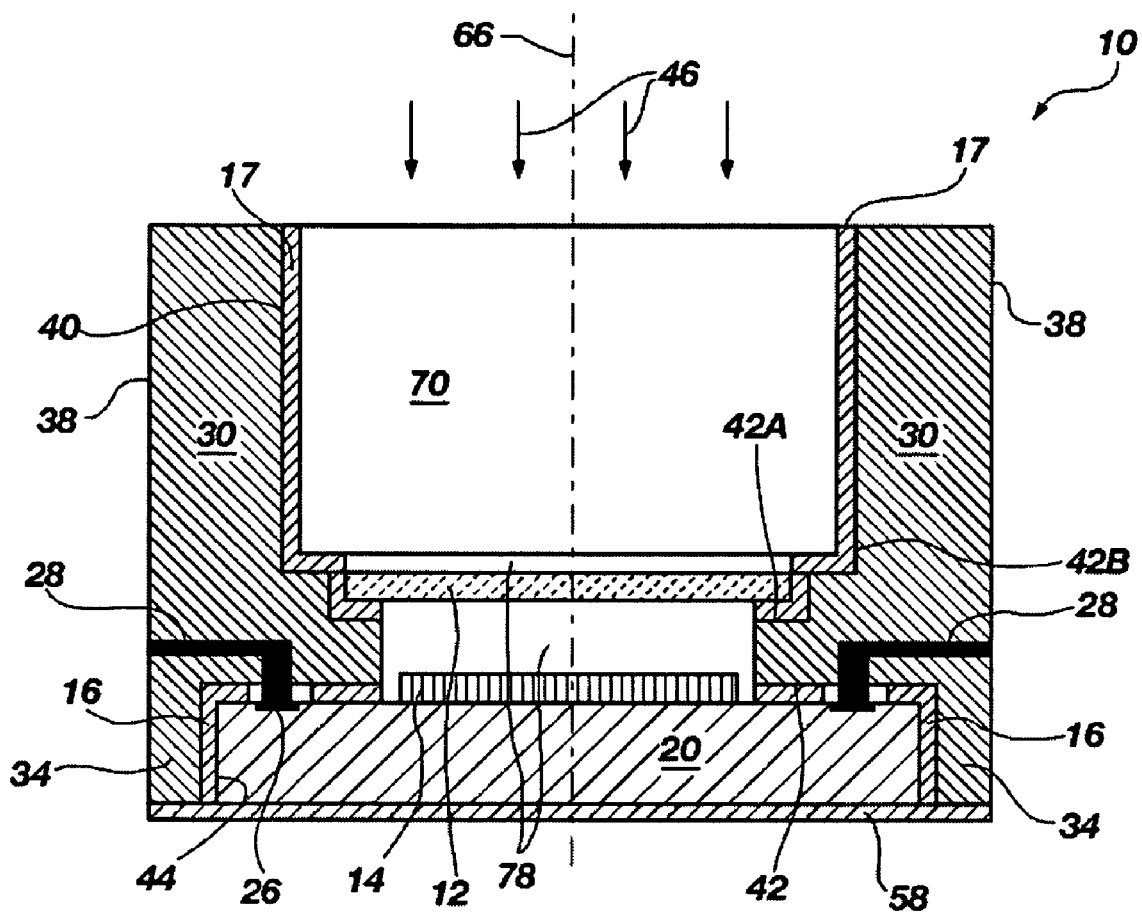
FIG. 5A is a cross-sectional lateral view of another exemplary frame of the present invention retaining an image sensor die and a camera lens.

External electrical connectors 36 or external connection structure 100, 200 may then be attached to or formed on the semiconductor package 10 (see FIGS. 2, 4, 5, 5A, 10, 11A and 11B). Thus, electrical signals may be transferred between the die bond pads 26 (for example as depicted in FIGS. 5 and 5A) and external components (not shown) through conductors 28 and external electrical connectors 36. Examples of apparatus of which the semiconductor package 10 may be a part include camera (cell) phones, digital cameras, home security system sensors, endoscopes, optical storage apparatus, personal digital assistants (PDAs), scientific testing devices, and the like. Any arrangement of suitable external electrical connectors 36 may be electrically and mechanically connected to conductors 28 of the semiconductor package 10 to provide a particular package configuration, including a ball-grid array (BGA), a leadless chip carrier (LCC), a quad flat pack (QFP), quad flat no-lead (QFN) or other package type known in the art.

Another exemplary embodiment of a semiconductor package 10 formed in accordance with the invention as an image sensor is shown in FIG. 4. A frame structure 50 is formed with a plurality of spaced apertures 40. Each aperture 40 is formed with a peripheral lower inverted step 42, a peripheral intermediate step 42B and a peripheral upper step 42A. Semiconductor die 20 is mounted to inverted step 42, whereby bond pads 26 thereon are placed in contact with and operably coupled to pads of in-frame conductors 28 to form DCA connections 68. A pre-lens 12B with focal characteristics is shown as being adhesively mounted on step 42B. A window 12, e.g., cover glass with one or more underlying color correcting filters 12A adhesively attached thereto or otherwise formed thereon is shown adhesively mounted on step 42A. The optical components are aligned about central optical axis 66. Alternatively, where the frame structure 50 is formed of a semiconductor material, the filter 12A may be joined to cover window 12 and inverted step 42 by (for example) anodic bonding or fusion bonding, as previously described. In this embodiment, internal spaces 78 remain between the semiconductor die 20 and pre-lens 12B, and between the pre-lens 12B and filter(s) 12A. A layer of encapsulant 58 is shown covering the back side of semiconductor dice 20 and adjacent lower surfaces 19 of frame structure 50. Singulation of the frame structure 50 along cut lines 52, 54 (see FIG. 3) results in a plurality of individual semiconductor packages 10 only requiring the mounting or fabrication of external connectors (not shown) on outer ends of conductors 28. Various ways of attaching external connectors to such packages are well known in the art and several examples are discussed below in detail.

Alternatively, as shown in FIG. 5, the frame 30 of a frame structure 50 may be formed so that spaces 78 between the components are substantially or essentially eliminated. As shown, the singulated frame 30 of FIG. 5 is also configured to hold a lens 70, the resulting semiconductor package 10 comprising a miniature camera with central optical axis 66 for forming images from impinging light 46 on the optically active region 14 of semiconductor die 20. In this embodiment, the window 12 has a pre-etched or pre-ground peripheral step 80 to enable a portion of the window to extend downwardly to generally meet the optical sensing or active region 14, to which it may be adhesively attached by a transparent adhesive material. In this embodiment, conductors 28 are shown formed over the inner surface 44 of the aperture 40, and extend to over the lower end of skirt 38 of frame 30. Thus, external connectors 36, shown in broken lines as conductive bumps, may be applied prior to singulation of frame structure 50. Alternatively, conductors 28 may be formed to extend over the sides of skirts 38 to form a castellated pad arrangement 28' (shown on the right-hand side of FIG. 5), which allows for solder connections to be formed directly to the periphery of frame 30 and is also suitable for use with other connection structures such as are described below. As with the embodiment illustrated in FIG. 2, when semiconductor die 20 includes through wafer interconnects or vias 29, external connectors such as terminal pads 36' (FIG. 2) may instead be formed on back side 24 of semiconductor die 20 over vias 29, and conductors 28 and wire bonds 32 may be omitted.

The lens 70 installed in a frame 30 or in frame structure 50 may be any miniature lens of a focusable, auto-focusing, or non-focusing type which may be fitted into the frame structure 50. The program for auto-focusing may be included in a die circuit, if desired. For example, a miniature lens 70 of one or more elements focusable by a Helimorth actuator is offered by 1 Ltd. Another lens 70 which may be used is a microfluidic FluidFocus lens of Koninklijke Philips Electronics, N.V. This lens is formed of two immiscible liquids of differing refractive index. The liquids are in a tube configured for applying a variable voltage at the interface, changing the shape of the meniscus to change the focal length.

Another embodiment of a semiconductor package 10 comprising a singulated camera is illustrated in FIG. 5A, differing from the embodiment of FIG. 5 with respect to the relative positions and spacing of semiconductor die 20, window 12 and lens 70, location and orientation of conductors 28, and back side encapsulation structure 58.

Figure 6:
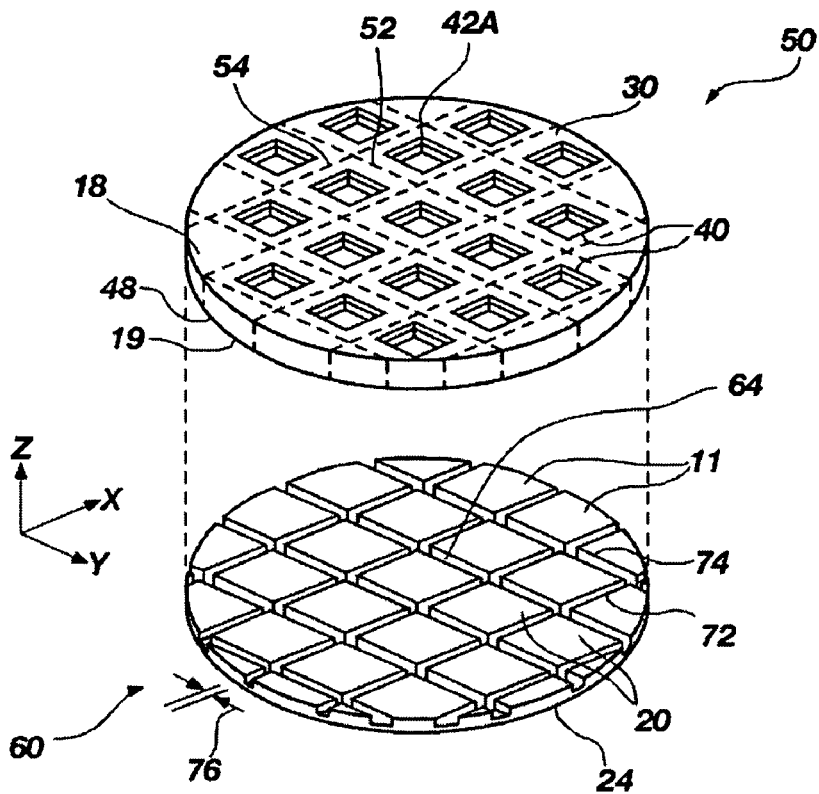
FIG. 6 is an exploded, upper isometric view of an exemplary frame structure in combination with a multi-die wafer, in accordance with an embodiment of the present invention.
Figure 7:
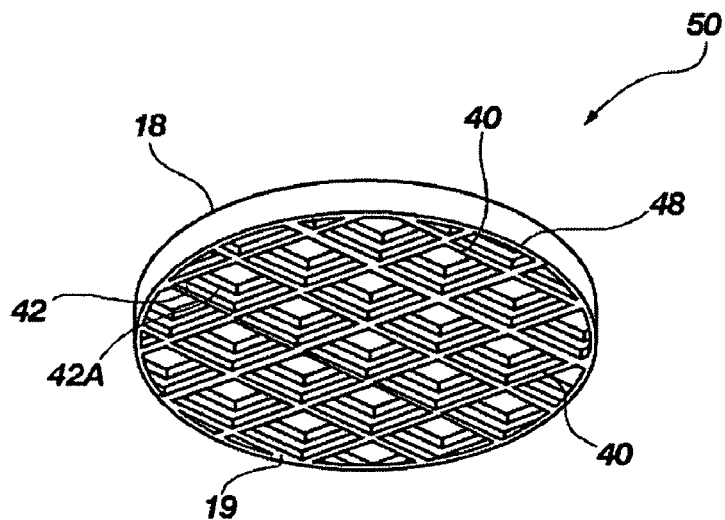
FIG. 7 is a lower isometric view of the exemplary frame structure of FIG. 6.
Figure 8:
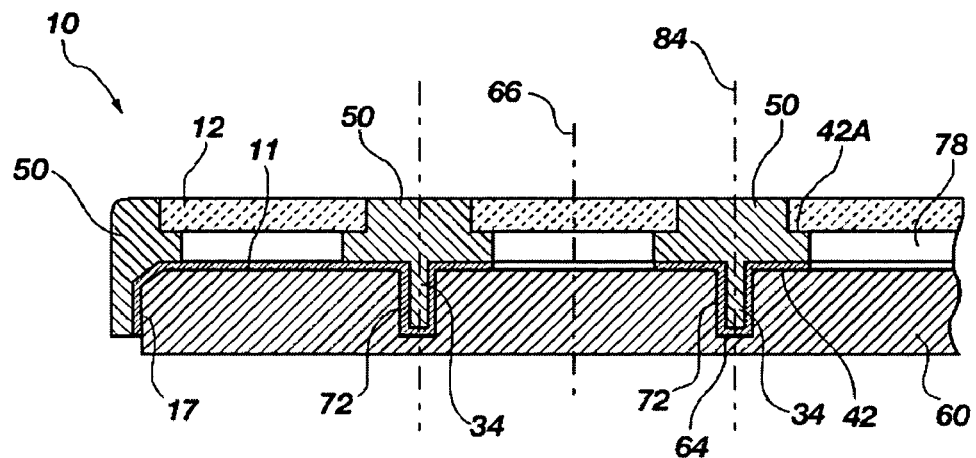
FIG. 8 is a cross-sectional view of a portion of an assembled frame structure and unsingulated wafer as depicted in FIG. 6, joined to form a plurality of image sensor packages, prior to final singulation in accordance with the present invention.
Figure 9:
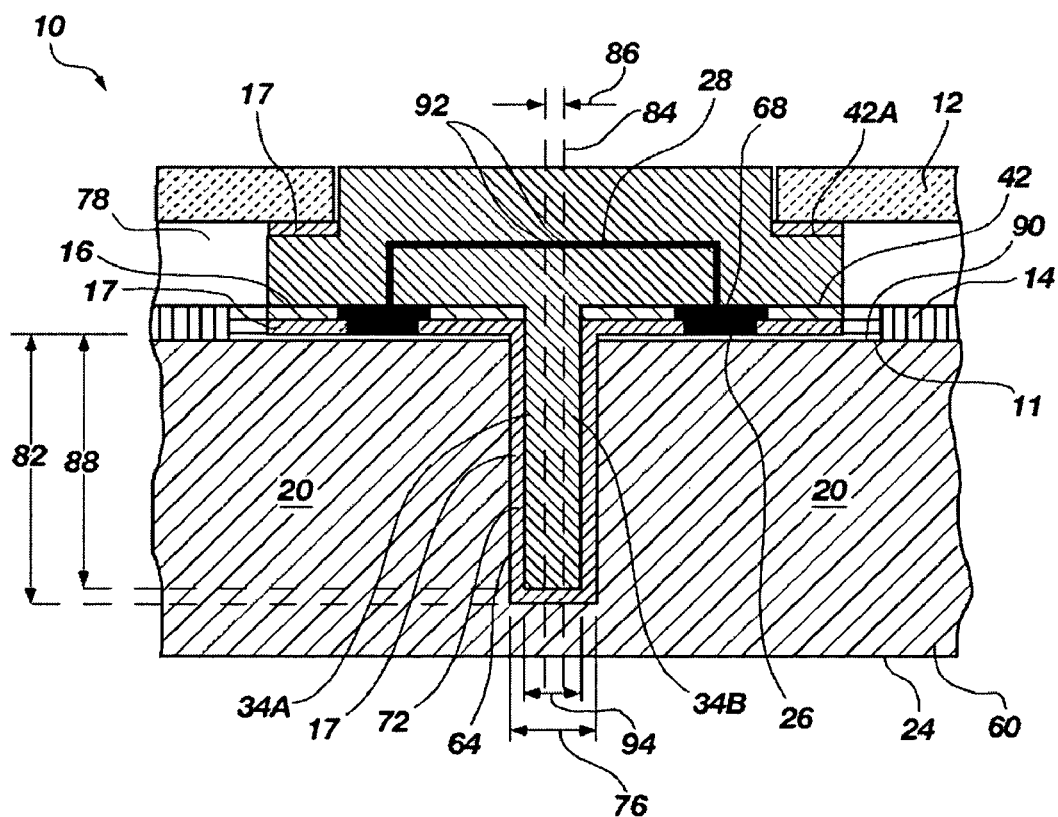
FIG. 9 is an enlarged portion of the cross-sectional view of FIG. 8, in accordance with the present invention.

In FIGS. 6 and 7, an embodiment of the present invention is shown in which an exemplary frame structure 50 including a plurality of frames 30 (shown in broken lines in FIG. 6) is configured to be joined to an unsingulated wafer 60 bearing a plurality of semiconductor dice 20 thereon and further processed to form an exemplary semiconductor package 10 such as is depicted in FIGS. 8 and 9. The frame structure 50 is formed with a network of conductors 28, as previously described. Kerfs 64 having a width 76 and depth 82 are made along streets 72, 74 lying between adjacent semiconductor dice 20. The width 76 and depth 82 of kerfs 64 are selected to enable receipt of frame protrusions 34 having reduced width 94 therein with clearance to receive an adhesive 17 to bond frame protrusions 34 to wafer 60 and to enable active surfaces 11 of the semiconductor dice 20 to abut and be mounted on inverted step 42. The kerfs 64 may be formed by use of a wafer saw, by a laser beam, or by anisotropic etching, all as known in the art and depending on what is suitable for forming the kerfs 64 in the material selected for frame structure 50. In practice, the kerf depth 82 may be made slightly deeper than the depth 88 of the frame protrusion 34, so that abutment between the active surface 11 and inverted step 42 uniformly controls the position of the optically active region 14 relative to the frame structure 50. The bond pads 26 of the individual semiconductor dice 20 may be joined to frame conductors 28 in DCA bonds, or wire bonds 32 may be used, as previously disclosed in FIGS. 2 and 4, for example. Further, if semiconductor dice 20 are provided with conductive vias 29 extending to the back sides 24 thereof, conductors 28 may be omitted from frames 30. Additional components, if any, may be adhesively placed on additional steps 42B, etc. (not shown in FIGS. 8 and 9) of the frame structure 50 if it is so configured, and a window 12 of glass or plastic, is joined to step 42A. If frame structure 50 is configured as shown, for example, in FIGS. 5 and 5A, a lens 70 may be adhesively joined to the window 12 and/or to the frame structure 50. The completed (or nearly completed) semiconductor packages 10 are then singulated by cutting through frame protrusions 34 and along cut lines 52, 54 (see FIG. 3) in alignment with streets 72, 74 to form a narrow kerf 84 having width 86 less than the wafer street width 76 and severing frame protrusions 34 into skirts 38. If desired, the back side 24 and any uncovered portions of the lateral sides 22 of semiconductor dice 20 extending below skirts 38 may be covered with encapsulant 58 (not shown in FIGS. 8 and 9).

As shown, the frame structure 50 is generally formed to have the same shape and size as the wafer 60, and has apertures 40 formed therein of a size and shape and at locations corresponding to the individual semiconductor dice 20 of the wafer 60. The frame structure 50 may be circular as depicted in FIGS. 6 and 7, or may be alternatively formed to encompass only a portion of the wafer 60, such as only full semiconductor dice 20.

As depicted in the example of FIG. 9, the active surface 11 of wafer 60 may have an oxide or nitride mask layer 90 to enhance bonding to frame structure 50. Of course, if individual semiconductor dice are disposed in a frame structure 50, or if a different frame configuration is employed, such as that described below with respect to FIG. 10, the oxide or nitride layer may be applied to or formed on side surfaces of the semiconductor dice or the back sides thereof. Adhesive material 17 such as, for example, epoxy may be placed in the kerf 64. Adhesive materials 16, 17 may be placed on portions of inverted step 42 and mating portions of the active surface 11, respectively. Alternatively, adhesives may be in the form of a thin film or tape with adhesive disposed on each side. Insertion of a frame protrusion 34 in the kerf 64 and curing of adhesive materials 16, 17 may be used to simultaneously mechanically join the wafer 60 to the multi-frame structure 50 and electrically connect semiconductor dice 20 to conductors 28 (in DCA connections).

Other methods may be used to join the wafer 60 and frame structure 50. For example, anodic or fusion type bonding may be used, or combinations of tape and epoxy adhesives may be used. As already described, a variety of adhesion methods may be used to install the window and other optical components on an inverted step 42, depending on the construction materials of the window and frame structure 50.

Final singulation of the wafer-and-frame structure combination along cut lines 52, 54 (see FIG. 3) singulates individual semiconductor packages 10 having frame protrusion portions 34A, 34B forming skirts 38 covering substantial portions of the lateral die sides 22. Uncovered portions of the lateral die sides 22 may be additionally encapsulated. External connectors of a desired type may be joined to the conductors 28 at the locations 92 where they are severed by final singulation.

Figure 9A:
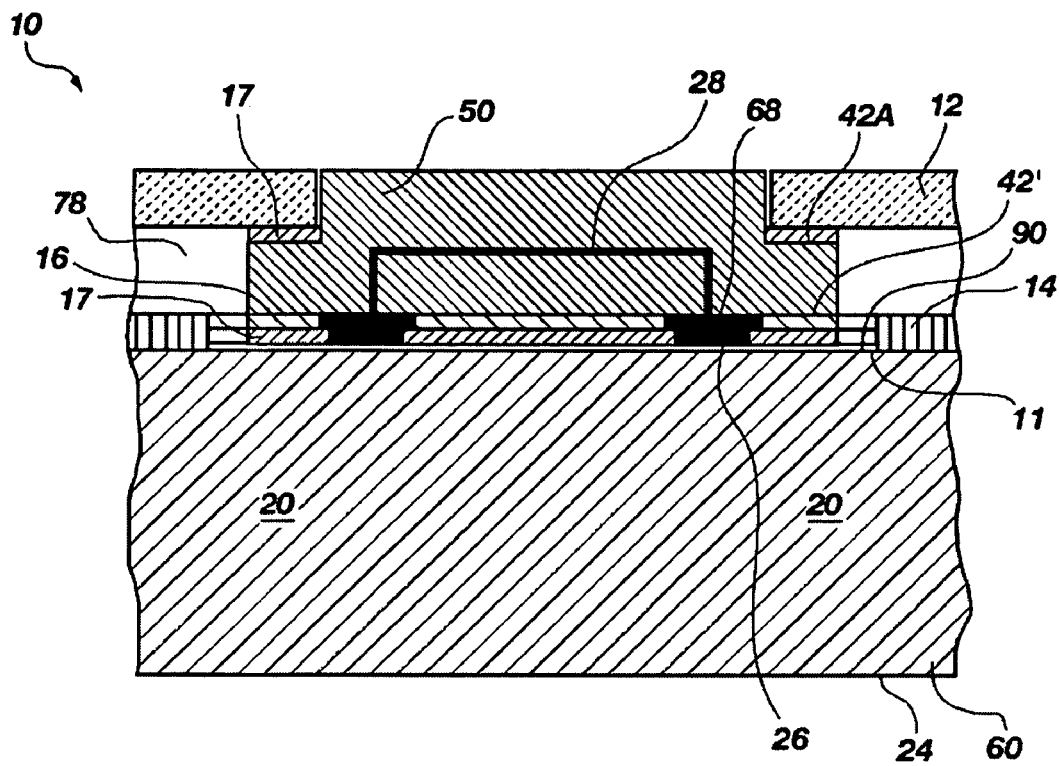
FIG. 9A is an alternate view of a frame structure that is configured to be attached to a wafer without kerfs.

The frame 30 used to fabricate semiconductor package 10 of FIGS. 8 and 9 may, of course, be configured for installation of a lens 70 in the aperture 40 atop window 12, as shown in FIG. 5, or on a step 42B as depicted in FIG. 5A. It is further possible that in some situations it may be unnecessary to cover portions of die sides 22 with frame material, or it may be undesirable or impracticable to form kerfs 64 in wafer 60 prior to attaching frame structure 50. In such instances, it is also contemplated that frame protrusions 34 may be omitted, as illustrated in FIG. 9A. With this configuration, surface 42' of frame structure 50 comprises a substantially planar surface that is attached to wafer 60, such as with adhesive materials 16, 17. The resulting wafer-and-frame structure may then be singulated in the same manner as described above, but will result in semiconductor packages 10 wherein frames 30 do not include skirts 38 covering portions of lateral die sides 22. In such an instance, the lateral die sides 22 and back sides 24 may be encapsulated, as desired, using techniques known in the art, or an external connection structure such as is described below with reference to FIG. 11A may be employed to provide both external electrical connections for a semiconductor die 20 as well as physical and environmental protection for the lateral die sides 22 and back side 24. Of course, semiconductor dice 20 may be fabricated with conductive vias extending to back sides 24 thereof, wherein external connection structures (including redistribution layers) may be formed or applied, eliminating the need for conductors 28 in frames structure 50.

Figure 10:
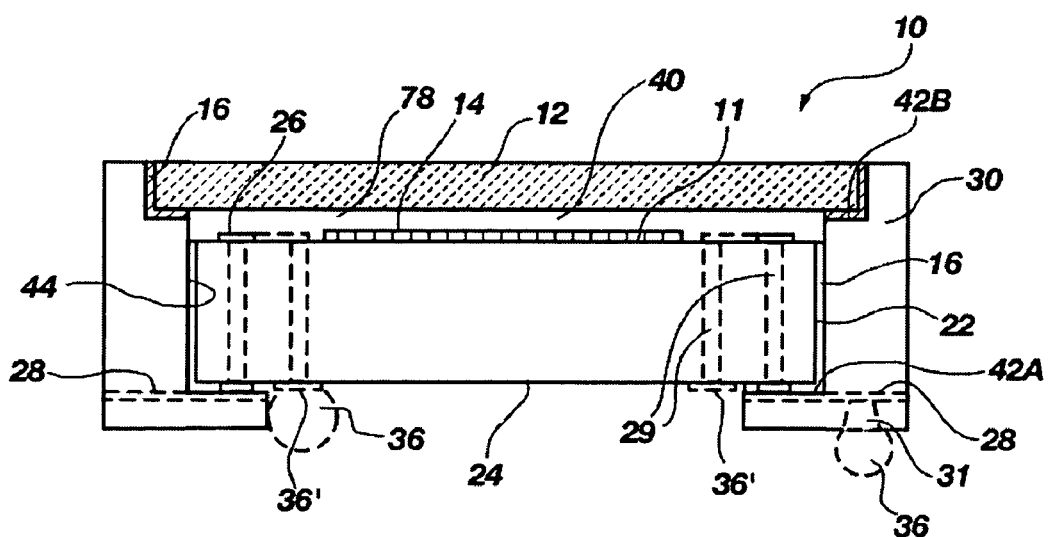
FIG. 10 is a cross-sectional lateral view of another exemplary semiconductor package including an optically transmissive window or cover glass, fabricated in accordance with the present invention.

In another embodiment of the present invention, illustrated in FIG. 10, another exemplary semiconductor package 10 is formed with a rectangular (by way of example only), radiation-transmissive window 12 superimposed over and in spaced relationship to an optically active region 14 on active surface 11 of a semiconductor die 20. Semiconductor die 20 may, again, comprise an image sensor die in the form of a CMOS imager and optically active region 14 may comprise an imager array of the CMOS imager. The exemplary semiconductor package 10 of this embodiment again carries rectangular window 12 mounted in an aperture 40 in the upper surface 18 of a frame 30 and bonded to frame 30 using an adhesive 16. As shown, the frame 30 extends about a lateral periphery of semiconductor die 20 and covers all or at least a major portion of the lateral sides 22 of semiconductor die 20. However, unlike the previous embodiments, semiconductor die 20 is supported by back side 24 thereof on frame 30, and the back side 24 and lateral sides 22 of semiconductor die 22 are bonded to frame 30 using an adhesive 16. As before, the relatively thin, downwardly extending lateral portions or skirts 38 of the frame 30 which encapsulate the lateral sides 22 of the semiconductor die 20 comprise portions of frame protrusions 34 which are cut through the centers thereof in a singulation step to result in a plurality of semiconductor packages 10 from a frame structure 50 including a plurality of frames 30. In the embodiment of FIG. 10, semiconductor die 20 includes through wafer interconnects or vias 29 that extend from bond pads 26 through semiconductor die 20 to back side 24. According to this configuration, external connectors in the form of terminal pads 36' may be formed over vias 29 on back side 24, preferably at the wafer level. If desired, external connectors 36 in the form of conductive bumps as shown in broken lines at the left-hand side of FIG. 10 may be disposed or formed on terminal pads 36' as known in the art or other connection structures, as further described below, may be employed. Of course, a back side redistribution layer comprising traces extending from vias 29 to other locations on the back side may also be employed. In such a configuration, the redistribution layer traces may extend to locations on step 42A wherein inner ends of conductors 28 placed in frame 30 are disposed, the conductors extending to an exterior surface of frame 30 after singulation thereof. Alternatively, and as shown in FIG. 10, conductive vias 29 may extend directly from bond pads 26 downwardly to conductors 28. In yet another external connection approach, conductive vias 31 as depicted in broken lines at the right-hand side of FIG. 10 may be formed through frame 30 to communicate with conductors 28, the outer ends of conductive vias 31 then having external connectors 36 in the form of conductive bumps disposed or formed thereon.

A singulated semiconductor die 20 which has preferably been established as KGD is mounted in an aperture 40 of each frame of the frame structure 50 using, for example, a pick-and-place machine (not shown), as is well known in the art. Each semiconductor die 20 may be adhesively attached and sealed to the surface of a step 42A in an aperture 40. Step 42A is formed about all four sides of aperture 40 to provide support and sealing completely around periphery of the back side 24 of semiconductor die 20. Semiconductor die 20 may have rows of bond pads 26 along one, two, three, or four peripheral edges of the active surface 11. The methods of the invention are also useful for packaging other devices, irrespective of the bond pad configuration thereof.

As before, a frame structure 50 comprises a plurality of frames 30, each frame with an aperture 40 formed therethrough. The aperture 40 is shown as having a generally rectangular, e.g., square, cross-section throughout, with steps (shelves) 42A and 42B extending about each side, as depicted in FIG. 10. The steps 42A, 42B, etc., may be configured for four-sided, sealed mounting of a singulated prefabricated semiconductor die 20 and other components therein including a window 12 such as a cover glass, as well as optical filters and/or lens and the like. The aperture 40 may be configured with as many steps 42A, 42B, etc. as are useful for mounting the various components required for the semiconductor package being fabricated, based on its intended use. As shown in FIG. 10, semiconductor die 20 has its back side 24 attached to step 42A of frame 30 by adhesive material 16, and lateral sides 22 of semiconductor die 20 may also be sealed to internal walls 44 of the frame 30 by the adhesive material 16.

Window 12, which may also be termed a cover glass, is shown as being generally rectangular, but (as noted above) is not limited to such shape and other polygonal shapes, as well as circular and nonplanar window shapes, may be employed. Window 12 may be formed of glass or other transparent or radiation-transmissive material such as a polymer. It may be formed of several layers and may be configured to selectively transmit radiation in a particular wavelength region, e.g., UV, infra-red, etc. Window 12 is preferably of high optical quality to provide uniform transmission therethrough of radiation over the entire usable field of the optically active region 14. Window 12 is mounted and sealed to step 42B, which lies above and laterally outward of step 42A carrying semiconductor die 20. If another component, such as, for example, a filter, is to be mounted between semiconductor die 20 and window 12, another, intervening step may, of course, be disposed between steps 42A and 42B.

Figure 11A:
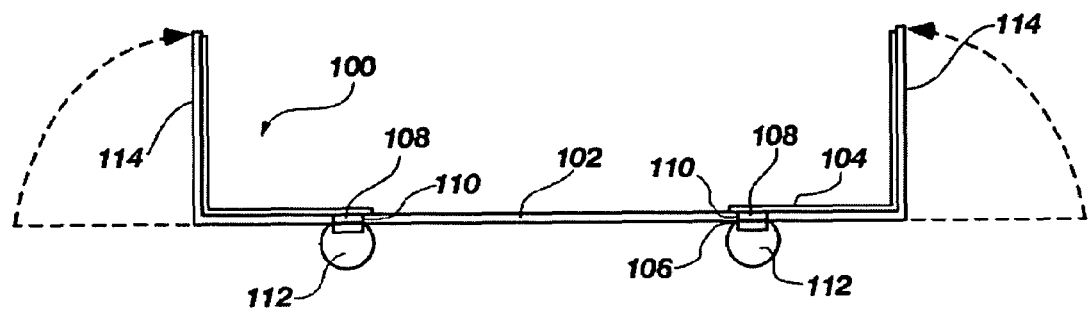
FIGS. 11A and 11B are side elevations of exemplary connection structures suitable for use with semiconductor packages according to the present invention.

It is contemplated that the present invention may employ, in a number of embodiments, connection structures similar to those disclosed and claimed in U.S. Pat. No. 6,368,896, assigned to the assignee of the present invention and the disclosure of which is incorporated herein by reference. Referring now to FIG. 11A, an external connection structure 100 is depicted in the form of a flexible dielectric film 102 carrying conductive elements in the form of conductive traces 104 on an upper surface thereof, conductive traces 104 communicating with terminal pads 106 on a lower surface of dielectric film 102 through vias 108 or, alternatively, terminal pads 106 may be formed directly onto the ends of traces 104 exposed through apertures 110. Conductive bumps 112, such as solder bumps or conductive or conductor-filled epoxy, may be disposed on terminal pads 106 or, if of a suitable composition, directly onto the exposed ends of traces 104. Such an external connection structure 100 may be employed with the embodiment of FIG. 1, wherein the outer ends 114 of dielectric film 102 may be wrapped upwardly as depicted in broken lines in FIG. 11A against the sides of frame 30 so that conductive traces 104 contact the exposed outer ends of conductors 28. It is contemplated that connection structure 102 may be cross shaped, to provide a central base portion to lie under semiconductor package 10 and four outer ends 114 to wrap up against the four sides of frame 30. Of course, depending upon the locations of bond pads 26 and conductors 28, fewer than four outer ends 114 may be required to effect all necessary connections. It is contemplated that external connection structure 100 may be adhered to frame 30 using an adhesive-coated tape, or other adhesive element or material disposed on the upper surface of dielectric film 102. External connection structure 100 may also be suitable for use with the embodiment of FIG. 5, wherein conductive traces 104 may be used to connect to castellated pads 28'.

Figure 11B:
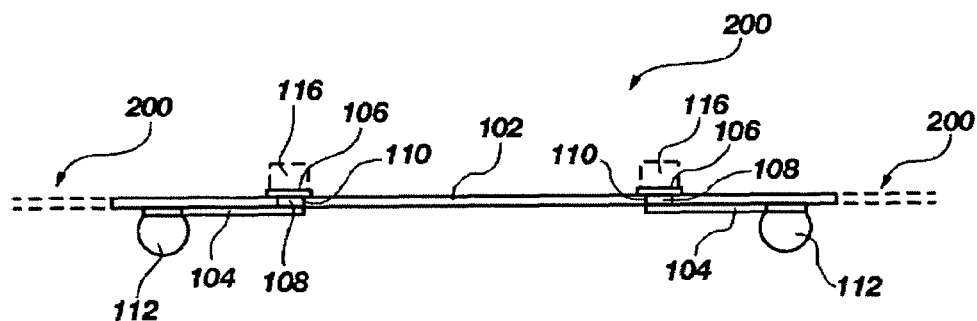

Another external connection structure 200 is depicted in FIG. 11B, external connection structure 200 again comprising a dielectric film 102 having conductive traces 104 on a lower surface thereof leading to conductive vias 108 in apertures 110, tipped by terminal pads 106. Traces 104 may have conductive bumps 112 disposed thereon at distal ends thereof. Connection structure 200 may be formed at the wafer level with each connection structure corresponding to the footprint of a frame 30 after singulation, and disposed on the lower surface of an assembly of a frame structure 50 and a wafer 60 or individual semiconductor dice 20 so as to contact the lower ends of through wafer interconnects or vias 29 with terminal pads 106 as depicted in FIGS. 2 and 10. Of course, where the back side 24 of a semiconductor die 20 is recessed as shown in FIG. 10, a conductive element 116 as shown in broken lines in FIG. 11B may be disposed on the upper side of each trace at the location of a via 29 to make contact therewith. External connection structure 200 may be adhered to the back sides 24 of semiconductor dice 20, frame 30, or both (depending on the embodiment), using an adhesive-coated tape or other adhesive element or material.

As is evident from the descriptions, the methods of the present invention enable the construction of semiconductor packages 10 with windows 12 for passage of radiation to or from an optically active region 14 on a semiconductor die 20. The methods use a minimal number of construction acts, conserve materials, and enable production of devices having precise placement of optical components including lenses.

Figure 12:
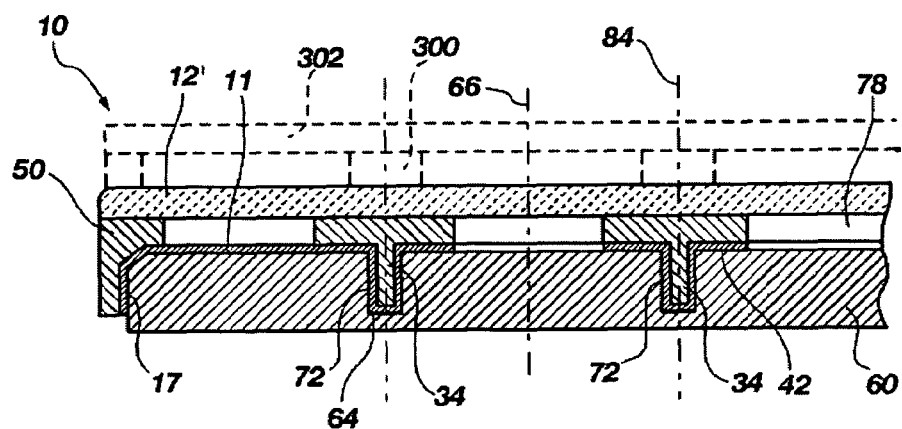
FIG. 12 is a lateral view of a frame structure and a single window extending over the entire frame structure prior to singulation thereof.

While the exemplary frame structures 50 of the above-described embodiments have been depicted as configured for receiving individual windows 12 seated within steps 42A, it is also possible that a single piece of window material may be attached over the entirety of a frame structure 50. FIG. 12 illustrates such a frame structure 50 wherein steps 42A are omitted, and a single, bulk substrate of window material 12' is adhered to cover the entire upper surface of frame structure 50. The frame structure 50 and adhered bulk substrate of window material 12' may be singulated in the same manner as previously described with respect to the foregoing embodiments, with the bulk substrate of window material 12' being cut into individual windows 12 overlying each semiconductor package 10. In this manner, the requirement of attaching multiple individual windows 12 to each frame 30 is eliminated. Furthermore, other components such as filters, lenses, etc. may be fabricated in bulk substrate form, secured to frame structure 50 prior to and in the same manner as bulk substrate of window material 12' and singulated with frame structure 50. If desired, an assembly comprising a laminate structure of such components in bulk substrate form may be preformed prior to securing to a frame structure 50, and the assembly then applied to frame structure 50 either before or after frame structure 50 is secured to a wafer 60. If vertical spacing between components is desired or required, such as between a window and an underlying or overlying lens, a grid configured to substantially match the pattern of frame structure 50 and of a thickness to provide the desired or required spacing or standoff may be employed between the components, which are adhered thereto. FIG. 12 shows, in broken lines, the use of a spacer grid 300 between bulk substrate of window material 12' and another component bulk substrate 302 thereover. Although FIG. 12 illustrates a frame structure 50 of the type configured for attachment to the active surface of an unsingulated, kerfed wafer 60, it should be understood that the concept of applying a bulk substrate of window material to substantially cover the entirety of a frame structure 50 may be incorporated into any of the embodiments previously described above. In other words, embodiments wherein singulated semiconductor dice 20 are disposed in frames 30 of a frame structure 50, frame structure 50 may be covered with a bulk substrate of window material 12'. Similarly, while FIG. 12 depicts a wafer 60 including kerfs 64 therein, a bulk substrate of window material 12' may be employed with a frame structure 50 as depicted in FIG. 9A, which does not include protrusions 34 and rests on the active surface of a wafer 50.

Although the foregoing description contains many specific structures and methods, these should not be construed as limiting the scope of the present invention, but merely as providing illustrations of some of the exemplary embodiments. Similarly, other embodiments of the invention may be devised which do not depart from the spirit or scope of the present invention. Moreover, features from different embodiments of the invention may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for packaging a semiconductor die, comprising:
   providing a frame structure including a plurality of frames, each frame of the plurality of frames including an aperture extending therethrough between an upper surface and a lower surface of the frame structure and each aperture having at least an inverted step extending peripherally thereabout and at least one upper step extending peripherally thereabout;
   securing a semiconductor die in the aperture of at least one frame of the plurality of frames with an active surface of the semiconductor die substantially abutting a surface of the at least an inverted step and a substantial portion of lateral sides thereof received within the aperture;
   securing a window in the aperture of the at least one frame with a surface of the window substantially abutting a surface of the at least one upper step; and
   cutting the frame structure between adjacent frames to singulate the at least one frame with the semiconductor die and the window secured therein and provide a skirt at a lower extent of the singulated at least one frame extending at least partially over a lateral side of the semiconductor die to form a semiconductor die package.

2. The method of claim 1, further comprising providing a plurality of conductors in association with each of the plurality of frames, the plurality of conductors including an inner end exposed for connection to a bond pad of a semiconductor die and an outer end located for exposure and communication with an external connector at least after the cutting of the frame structure.

3. The method of claim 2, further comprising operably coupling bond pads of the semiconductor die secured in the aperture of the at least one frame to inner ends of the plurality of conductors thereof.

4. The method of claim 3, further comprising operably coupling the outer ends of the plurality of conductors to at least one external connection structure.

5. The method of claim 4, wherein operably coupling the outer ends of the plurality of conductors to at least one external connection structure comprises at least one of disposing or forming conductive bumps thereon, disposing or forming conductive lands thereon, and disposing a dielectric film having conductive elements thereon over the back side of the semiconductor die and contacting the outer ends of the plurality of conductors with the conductive elements.

6. The method of claim 5, wherein operably coupling the outer ends of the plurality of conductors to at least one external connection structure comprises disposing a dielectric film having conductive elements thereon over the back side of the semiconductor die and contacting the outer ends of the plurality of conductors with the conductive elements and further comprises wrapping a portion of the dielectric film upwardly against at least one side of the frame to effect contact between the outer ends of the plurality of conductors and the conductive elements.

7. The method of claim 2, further including exposing the outer ends of the plurality of conductors by cutting the frame structure.

8. The method of claim 7, further comprising operably coupling the exposed outer ends of the plurality of conductors to at least one external connection structure.

9. The method of claim 8, wherein operably coupling the outer ends of the plurality of conductors to at least one external connection structure comprises at least one of disposing or forming conductive lands thereon, and disposing a dielectric film having conductive elements thereon over the back side of the semiconductor die and contacting the outer ends of the plurality of conductors with the conductive elements.

10. The method of claim 9, wherein operably coupling the outer ends of the plurality of conductors to at least one external connection structure comprises disposing a dielectric film having conductive elements thereon over the back side of the semiconductor die and contacting the outer ends of the plurality of conductors with the conductive elements and further comprises wrapping a portion of the dielectric film upwardly against at least one side of the frame to effect contact between the outer ends of the plurality of conductors and the conductive elements.

11. The method of claim 1, further comprising:
    fabricating a plurality of semiconductor dice on a wafer, testing the plurality of semiconductor dice to selectively characterize at least some of the plurality of semiconductor dice as known good dice;
    wherein securing the semiconductor die the aperture of at least one frame of the plurality of frames comprises securing a known good die therein.

12. The method of claim 1, wherein securing the semiconductor die in the aperture of the at least one frame comprises adhesively securing the surface of the semiconductor die to the at least an inverted step.

13. The method of claim 1, further comprising forming the window in a size and configuration to fit within the aperture of the at least one frame.

14. The method of claim 1, wherein securing the window in the aperture of the at least one frame comprises adhesively securing the window to the at least one upper step.

15. The method of claim 1, further comprising substantially encapsulating a back side of the semiconductor die disposed in the aperture of the at least one frame with a dielectric material.

16. The method of claim 1, further including providing peripheral bond pads on the surface of the semiconductor die and operably coupling the bond pads to inner ends of conductors carried by the at least one frame of the plurality of frames.

17. The method of claim 16, wherein operably coupling comprises one of wire bonding and direct chip attach.

18. The method of claim 1, wherein securing the semiconductor die comprises securing a semiconductor die comprising an optically active region on the surface thereof.

19. The method of claim 18, wherein securing the semiconductor die comprising the optically active region on the surface thereof comprises securing one of a CMOS imager and a CCD imager.

20. The method of claim 18, wherein securing the semiconductor die comprising the optically active region on the surface thereof comprises securing one of a die configured for sensing radiation and a die configured for emitting radiation.

21. The method of claim 1, further comprising fabricating the frame structure from a polymer by injection molding.

22. The method of claim 1, further comprising fabricating the frame structure by placing a plurality of conductors into a mold defining the plurality of frames and the apertures thereof with inner ends thereof adjacent locations of the apertures and outer ends thereof located proximate outer peripheries of the plurality of frames, injecting polymeric molding material into the mold, curing the polymeric material, and removing the frame structure from the mold.

23. The method of claim 1, further including fabricating the frame structure of one of a liquid crystal polymer and a rod type polymer.

24. The method of claim 1, further including fabricating the frame structure of a semiconductor material and forming the apertures by at least one of etching and laser ablation.

25. The method of claim 1, further comprising covering at least a portion of the frame structure or the semiconductor die with an oxide or nitride film.

26. The method of claim 1, further comprising stereolithographically fabricating the frame structure from a photopolymer.

27. The method of claim 1, further comprising fabricating the frame structure from metal or an alloy by at least one of stamping, pressing, casting and machining.

28. The method of claim 1, further comprising forming the semiconductor die with conductive vias extending from the active surface to a back side thereof; and operably coupling the conductive vias to an external connection structure.

29. The method of claim 28, wherein operably coupling the conductive vias to an external connection structure comprises at least one of disposing or forming conductive bumps thereon, disposing or forming conductive lands thereon, and disposing a dielectric film having conductive elements thereon over the back side of the semiconductor die and contacting the conductive vias with the conductive elements.

30. The method of claim 1, wherein the frames of the plurality are each configured to retain a lens therein and further comprising securing a lens in the aperture.

31. The method of claim 30, wherein the lens includes a Helimorph actuator for focusing.

32. The method of claim 30, wherein the lens comprises a microfluidic lens of two immiscible liquids in a hydrophobic tube and is configured for adjustment of focal length responsive to selective application of a voltage.

33. The method of claim 1, further including disposing the semiconductor die package in one of a digital camera, camera (cell) phone, PDA, home security system, endoscope, optical storage apparatus and scientific testing apparatus.

34. The method of claim 1, further comprising forming the plurality of frames of the frame structure to include at least the at least an inverted step, the at least one upper step, and the at least another upper step.

35. The method of claim 1, wherein the at least one upper step comprises at least another upper step and further comprising securing an optical component to the at least another upper step.

36. The method of claim 35, further comprising selecting the optical component from the group consisting of a lens, a filter and a pre-lens.

37. The method of claim 31, further comprising forming the plurality of semiconductor dice with conductive vias extending from the active surface to a back side thereof; and operably coupling the conductive vias to an external connection structure.

38. The method of claim 37, wherein operably coupling the conductive vias to an external connection structure comprises at least one of disposing or forming conductive bumps thereon, disposing or forming conductive lands thereon, and disposing a dielectric film having conductive elements thereon over the back sides of the plurality of semiconductor dice and contacting the conductive vias with the conductive elements.

39. A method for packaging a semiconductor die, comprising:
providing a wafer bearing a plurality of semiconductor dice thereon, wherein semiconductor dice of the plurality of semiconductor dice are separated by kerfs extending downwardly into the wafer from an surface thereof along streets between the semiconductor dice of the plurality of semiconductor dice;
providing a frame structure including a plurality of frames, each frame of the plurality of frames including an aperture extending therethrough between an upper surface and a lower surface of the frame structure and each aperture having at least an inverted step extending peripherally thereabout and at least one upper step extending peripherally thereabout, the lower surface of the frame structure further including protrusions sized and configured to be received in the kerfs;
aligning the lower surface of the frame structure with the surface of the wafer and inserting the protrusions into the kerfs until the surface of the wafer substantially abuts the inverted lower steps of the plurality of frames and the protrusions extend over lateral sides of the plurality of semiconductor dice defined by the kerfs and securing the plurality of semiconductor dice to the plurality of frames; and
securing windows in at least some of the apertures with surfaces of the windows substantially abutting surfaces of the at least one upper step.

40. The method of claim 39, further comprising:
cutting the frame structure between adjacent frames along centers of the kerfs and through a remaining thickness of the wafer to singulate the frames of the plurality of frames with a semiconductor die secured therein and provide a skirt at a lower extent of the singulated frames of the plurality of frames extending at least partially over a lateral side of the semiconductor die to form a semiconductor die package.

41. The method of claim 40, further comprising providing a plurality of conductors in association with each of the plurality of frames, the plurality of conductors including an inner end exposed for connection to a bond pad of a semiconductor die and an outer end located for exposure and communication with an external connector at least after the cutting of the frame structure.

42. The method of claim 41, further comprising operably coupling bond pads of the plurality of semiconductor dice secured in the plurality of frames to inner ends of the plurality of conductors thereof.

43. The method of claim 42, further comprising operably coupling the outer ends of the plurality of conductors to at least one external connection structure.

44. The method of claim 43, wherein operably coupling the outer ends of the plurality of conductors to at least one external connection structure comprises at least one of disposing or forming conductive bumps thereon, disposing or forming conductive lands thereon, and disposing a dielectric film having conductive elements thereon over the back side of the semiconductor die and contacting the outer ends of the plurality of conductors with the conductive elements.

45. The method of claim 44, wherein operably coupling the outer ends of the plurality of conductors to at least one external connection structure comprises disposing a dielectric film having conductive elements thereon over the back side of the semiconductor die and contacting the outer ends of the plurality of conductors with the conductive elements and further comprises wrapping a portion of the dielectric film upwardly against at least one side of the frame to effect contact between the outer ends of the plurality of conductors and the conductive elements.

46. The method of claim 41, further including exposing the outer ends of the plurality of conductors by cutting the frame structure.

47. The method of claim 46, further comprising operably coupling the exposed outer ends of the plurality of conductors to at least one external connection structure.

48. The method of claim 47, wherein operably coupling the outer ends of the plurality of conductors to at least one external connection structure comprises at least one of disposing or forming conductive lands thereon, and disposing a dielectric film having conductive elements thereon over the back side of the semiconductor die and contacting the outer ends of the plurality of conductors with the conductive elements.

49. The method of claim 48, wherein operably coupling the outer ends of the plurality of conductors to at least one external connection structure comprises disposing a dielectric film having conductive elements thereon over the back side of the semiconductor die and contacting the outer ends of the plurality of conductors with the conductive elements and further comprises wrapping a portion of the dielectric film upwardly against at least one side of the frame to effect contact between the outer ends of the plurality of conductors and the conductive elements.

50. The method of claim 39, further comprising:
fabricating the plurality of semiconductor dice on the wafer, testing the plurality of semiconductor dice to selectively characterize at least some of the plurality of dice as known good dice.

51. The method of claim 39, wherein securing the plurality of semiconductor dice to the plurality of frames comprises adhesively securing surfaces thereof to the at least an inverted step.

52. The method of claim 39, further comprising forming the windows in a size and configuration to fit within the apertures.

53. The method of claim 39, wherein securing the windows in the at least some of the apertures comprises adhesively securing the windows to the at least one upper step.

54. The method of claim 39, further comprising substantially encapsulating a back side of the wafer with a dielectric material.

55. The method of claim 39, further including providing peripheral bond pads on surfaces of the plurality of semiconductor dice and operably coupling the bond pads to inner ends of conductors carried by the frame structure.

56. The method of claim 55, wherein operably coupling comprises one of wire bonding and direct chip attach.

57. The method of claim 39, wherein securing the plurality of semiconductor dice comprises securing semiconductor dice each comprising an optically active region on a surface thereof.

58. The method of claim 57, wherein securing the semiconductor dice comprising the optically active region on the surface thereof comprises securing one of CMOS imagers and CCD imagers.

59. The method of claim 57, wherein securing the semiconductor dice comprising the optically active region on the surface thereof comprises securing one of a die configured for sensing radiation and a die configured for emitting radiation.

60. The method of claim 39, further comprising fabricating the frame structure from a polymer by injection molding.

61. The method of claim 60, further comprising fabricating the frame structure by placing a plurality of conductors into a mold defining the plurality of frames and the apertures thereof with inner ends thereof adjacent locations of the apertures and outer ends thereof located proximate outer peripheries of the plurality of frames, injecting polymeric molding material into the mold, curing the polymeric material, and removing the frame structure from the mold.

62. The method of claim 39, further including fabricating the frame structure of one of a liquid crystal polymer and a rod type polymer.

63. The method of claim 39, further including fabricating the frame structure of a semiconductor material and forming the apertures by at least one of etching and laser ablation.

64. A packaging method of claim 63, further comprising covering at least a portion of the frame structure with an oxide film.

65. The method of claim 39, further comprising stereolithographically fabricating the frame structure from a photopolymer.

66. The method of claim 39, further comprising fabricating the frame structure from metal or an alloy by at least one of stamping, pressing, casting and machining.

67. The method of claim 39, wherein the frames of the plurality are each configured to retain a lens therein and further comprising securing a lens in at least some of the apertures.

68. The method of claim 67, wherein the lens includes a Helimorph actuator for focusing.

69. The method of claim 67, wherein the lens comprises a microfluidic lens of two immiscible liquids in a hydrophobic tube and is configured for adjustment of focal length responsive to selective application of a voltage.

70. The method of claim 40, further including disposing the semiconductor die package in one of a digital camera, camera (cell) phone, PDA, home security system, endoscope, optical storage apparatus and scientific testing apparatus.

71. The method of claim 39, further comprising forming each of the plurality of frames of the frame structure to include the at least an inverted step and the at least one upper step.

72. The method of claim 71, further comprising forming each of the plurality of frames of the frame structure to include at least another upper step.

73. The method of claim 39, wherein the at least one upper step comprises at least another upper step and further comprising securing an optical component to the at least another upper step.

74. The method of claim 73, further comprising selecting the optical component from the group consisting of a lens, a filter and a pre-lens.

75. The method of claim 39, wherein at least one of the plurality of semiconductor dice and the windows are attached to the plurality of frames by one of anodic bonding and fusion bonding.

76. A method for packaging a semiconductor die, comprising:
providing a frame structure including a plurality of frames, each frame of the plurality of frames including an aperture extending therethrough between an upper surface and a lower surface of the frame structure and each aperture having a first step extending peripherally thereabout and at least another, higher step extending peripherally thereabout and peripherally about the first step;
securing a semiconductor die comprising an active surface and an opposing back side in the aperture of at least one frame of the plurality of frames with the back side of the semiconductor die substantially abutting a surface of a first step and lateral sides thereof received within the aperture; and
securing a window in the aperture of the at least one frame of the plurality of frames with a surface of the window substantially abutting a surface of the at least another, higher step.

77. The method of claim 76, further comprising:
cutting the frame structure between adjacent frames to singulate the at least one frame with the semiconductor die and the window secured therein and provide a skirt at a lower extent of the singulated at least one frame extending at least partially over a lateral side of the semiconductor die to form a semiconductor die package.

78. The method of claim 77, further comprising providing a plurality of conductors in association with each of the plurality of frames, the plurality of conductors including an inner end exposed for connection to a semiconductor die and an outer end located for exposure and communication with an external connector at least after the cutting of the frame structure.

79. The method of claim 78, further comprising operably coupling the semiconductor die secured in the aperture of the at least one frame to inner ends of the plurality of conductors thereof.

80. The method of claim 79, further comprising operably coupling the outer ends of the plurality of conductors to at least one external connection structure.

81. The method of claim 80, wherein operably coupling the outer ends of the plurality of conductors to at least one external connection structure comprises at least one of disposing or forming conductive bumps thereon, disposing or forming conductive lands thereon, and disposing a dielectric film having conductive elements thereon over the back side of the semiconductor die and contacting the outer ends of the plurality of conductors with the conductive elements.

82. The method of claim 81, wherein operably coupling the outer ends of the plurality of conductors to at least one external connection structure comprises disposing a dielectric film having conductive elements thereon over the back side of the semiconductor die and contacting the outer ends of the plurality of conductors with the conductive elements and further comprises wrapping a portion of the dielectric film upwardly against at least one side of the frame to effect contact between the outer ends of the plurality of conductors and the conductive elements.

83. The method of claim 78, further including exposing the outer ends of the plurality of conductors by cutting the frame structure.

84. The method of claim 83, further comprising operably coupling the outer ends of the plurality of conductors to at least one external connection structure.

85. The method of claim 84, wherein operably coupling the outer ends of the plurality of conductors to at least one external connection structure comprises at least one of disposing or forming conductive lands thereon, and disposing a dielectric film having conductive elements thereon over the back side of the semiconductor die and contacting the outer ends of the plurality of conductors with the conductive elements.

86. The method of claim 85, wherein operably coupling the outer ends of the plurality of conductors to at least one external connection structure comprises disposing a dielectric film having conductive elements thereon over the back side of the semiconductor die and contacting the outer ends of the plurality of conductors with the conductive elements and further comprises wrapping a portion of the dielectric film upwardly against at least one side of the frame to effect contact between the outer ends of the plurality of conductors and the conductive elements.

87. The method of claim 76, further comprising:
fabricating a plurality of semiconductor dice on a wafer, testing the plurality of semiconductor dice to selectively characterize at least some of the plurality of dice as known good dice; and
wherein securing the semiconductor die the aperture of at least one frame of the plurality of frames comprises securing a known good die therein.

88. The method of claim 76, wherein securing the semiconductor die in the aperture of the at least one frame comprises adhesively securing the back side of the semiconductor die to the first step.

89. The method of claim 76, further comprising forming the window in a size and configuration to fit within the aperture of the at least one frame.

90. The method of claim 76, wherein securing the window in the aperture of the at least one frame comprises adhesively securing the window to the at least another, higher step.

91. The method of claim 76, further comprising substantially encapsulating a back side of the semiconductor die disposed in the aperture of the at least one frame with a dielectric material.

92. The method of claim 76, further including providing conductive vias extending from an active surface to the back side of the semiconductor die and operably coupling interconnects to inner ends of conductors carried by the at least one frame of the plurality of frames.

93. The method of claim 92, further comprising disposing or forming conductive bumps on outer ends of the conductors carried by the at least one frame exposed on the lower surface of the frame structure.

94. The method of claim 76, further including providing conductive vias extending from an active surface to the back side of the semiconductor die within a periphery of the first step.

95. The method of claim 94, further comprising disposing or forming conductive bumps on the back side of the semiconductor die operably coupled to ends of the conductive vias.

96. The method of claim 76, wherein securing the semiconductor die comprises securing a semiconductor die comprising an optically active region on the surface thereof.

97. The method of claim 96, wherein securing the semiconductor die comprising the optically active region on the surface thereof comprises securing one of a CMOS imager and a CCD imager.

98. The method of claim 96, wherein securing the semiconductor die comprising the optically active region on the surface thereof comprises securing one of a die configured for sensing radiation and a die configured for emitting radiation.

99. The method of claim 76, further comprising fabricating the frame structure from a polymer by injection molding.

100. The method of claim 99, further comprising fabricating the frame structure by placing a plurality of conductors into a mold defining the plurality of frames and the apertures thereof with inner ends thereof adjacent locations of the apertures and outer ends thereof located proximate outer peripheries of the plurality of frames, injecting polymeric molding material into the mold, curing the polymeric material, and removing the frame structure from the mold.

101. The method of claim 76, further including fabricating the frame structure of one of a liquid crystal polymer and a rod type polymer.

102. The method of claim 76, further including fabricating the frame structure of a semiconductor material and forming the apertures by at least one of etching and laser ablation.

103. The method of claim 102, further comprising covering at least a portion of the frame structure or the semiconductor die with an oxide or nitride film.

104. The method of claim 76, further comprising stereolithographically fabricating the frame structure from a photopolymer.

105. The method of claim 76, further comprising fabricating the frame structure from metal or an alloy by at least one of stamping, pressing, casting and machining.

106. The method of claim 76, wherein the frames of the plurality are each configured to retain a lens therein and further comprising securing a lens in the aperture.

107. The method of claim 106, wherein the lens includes a Helimorph actuator for focusing.

108. The method of claim 106, wherein the lens comprises a microfluidic lens of two immiscible liquids in a hydrophobic tube and is configured for adjustment of focal length responsive to selective application of a voltage.

109. The method of claim 77, further including disposing the semiconductor die package in one of a digital camera, camera (cell) phone, PDA, home security system, endoscope, optical storage apparatus and scientific testing apparatus.

110. The method of claim 76, further comprising forming the plurality of frames of the frame structure to include at least the first step and the at least another, higher step.

111. The method of claim 110, further comprising forming the plurality of frames of the frame structure to include at least a further, higher step below the another, higher step and encompassed peripherally thereby.

112. The method of claim 111, further comprising securing an optical component to the at least a further, higher step.

113. The method of claim 112, further comprising selecting the optical component from the group consisting of a lens, a filter and a pre-lens.

114. A method for packaging a semiconductor die, comprising:

providing a wafer bearing a plurality of semiconductor dice thereon, wherein semiconductor dice of the plurality of semiconductor dice are separated by kerfs extending downwardly into the wafer from an surface thereof along streets between the semiconductor dice of the plurality;

providing a frame structure including a plurality of frames, each frame of the plurality of frames including an aperture extending therethrough between an upper surface and a lower surface of the frame structure and each aperture having at least an inverted step extending peripherally thereabout, the lower surface of the frame structure further including protrusions sized and configured to be received in the kerfs;

aligning the lower surface of the frame structure with the surface of the wafer and inserting the protrusions into the kerfs until the surface of the wafer substantially abuts the inverted lower steps of the plurality of frames and the protrusions extend over lateral sides of the plurality of semiconductor dice defined by the kerfs and securing the plurality of semiconductor dice to the plurality of frames; and securing a window substrate over the upper surface of the frame structure and over the apertures of the plurality of frames.

115. The method of claim 114, further comprising:

cutting the frame structure and window substrate between adjacent frames along centers of the kerfs and through a remaining thickness of the wafer to singulate the frames of the plurality with a semiconductor die secured therein and windows secured thereover and provide a skirt at a lower extent of the singulated frames of the plurality extending at least partially over a lateral side of the semiconductor die to form a semiconductor die package.

116. A method for packaging a semiconductor die, comprising:

forming a wafer comprising a plurality of semiconductor dice on an active surface thereof separated by kerfs extending into the wafer along streets between semiconductor dice of the plurality of semiconductor dice;

forming a frame structure comprising a plurality of frames, each frame of the plurality of frames including an aperture extending therethrough between an upper surface and a lower surface of the frame structure, and at least one upper step extending peripherally about the aperture;

aligning the frame structure with the active surface of the wafer and securing protrusions of the frame structure to the kerfs of the wafer, each aperture of a frame exposing a semiconductor die of the plurality of semiconductor dice; and securing windows in at least some of the apertures with surfaces of the windows substantially abutting surfaces of the at least one upper step.

117. The method of claim 116, further comprising:

cutting the frame structure between adjacent frames along streets lying between semiconductor dice of the plurality of semiconductor dice and through a thickness of the wafer to singulate the frames of the plurality of frames with a semiconductor die secured thereto and windows secured therein to form a semiconductor die package.

118. A method for packaging a semiconductor die, comprising:

providing a frame structure including a plurality of frames, each frame of the plurality of frames including an aperture extending therethrough between an upper surface and a lower surface of the frame structure and each aperture having a first step extending peripherally thereabout;

securing a semiconductor die comprising an active surface and an opposing back side in the aperture of at least one frame of the plurality of frames with the back side of the semiconductor die substantially abutting a surface of a first step and lateral sides thereof received within the aperture; and securing a window substrate over the upper surface of the frame structure over the aperture of the frames.

119. The method of claim 118, further comprising:

cutting the frame structure between adjacent frames to singulate the at least one frame with the semiconductor die secured therein and a window secured thereover and provide a skirt at a lower extent of the singulated at least one frame extending at least partially over a lateral side of the semiconductor die to form a semiconductor die package.

* * * * *

UNITED STATES PATENT AND TRADEMARK OFFICE
CERTIFICATE OF CORRECTION

| | | |
|---|---|---|
| PATENT NO. | : 7,645,635 B2 | Page 1 of 1 |
| APPLICATION NO. | : 10/919604 | |
| DATED | : January 12, 2010 | |
| INVENTOR(S) | : Alan G. Wood et al. | |

It is certified that error appears in the above-identified patent and that said Letters Patent is hereby corrected as shown below:

On the Title page, in field (56), under "Other Publications", in column 2, line 1, delete "I" and insert -- 1 --, therefor.

In column 18, line 63, in Claim 12, delete "surface" and insert -- active surface --, therefor.

Signed and Sealed this

Twenty-third Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,645,635 B2  Page 1 of 1
APPLICATION NO. : 10/919604
DATED : January 12, 2010
INVENTOR(S) : Wood et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 351 days.

Signed and Sealed this

Sixteenth Day of November, 2010

David J. Kappos
*Director of the United States Patent and Trademark Office*